(12) United States Patent
Smith et al.

(10) Patent No.: US 12,336,274 B2
(45) Date of Patent: Jun. 17, 2025

(54) SELF-ALIGNED METHOD FOR VERTICAL RECESS FOR 3D DEVICE INTEGRATION

(71) Applicant: Tokyo Electron Limited, Tokyo (JP)

(72) Inventors: Jeffrey Smith, Clifton Park, NY (US); Daniel Chanemougame, Niskayuna, NY (US); Lars Liebmann, Mechanicsville, NY (US); Paul Gutwin, Williston, VT (US); Subhadeep Kal, Albany, NY (US); Kandabara Tapily, Mechanicsville, NY (US); Anton Devilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 514 days.

(21) Appl. No.: 17/878,457

(22) Filed: Aug. 1, 2022

(65) Prior Publication Data

US 2023/0036597 A1    Feb. 2, 2023

Related U.S. Application Data

(60) Provisional application No. 63/228,473, filed on Aug. 2, 2021.

(51) Int. Cl.
*H10D 30/67* (2025.01)
*H01L 21/285* (2006.01)
(Continued)

(52) U.S. Cl.
CPC ..... *H10D 84/038* (2025.01); *H01L 21/28518* (2013.01); *H10D 30/014* (2025.01); *H10D 30/031* (2025.01); *H10D 30/43* (2025.01); *H10D 30/6729* (2025.01); *H10D 30/6735* (2025.01); *H10D 30/6757* (2025.01); *H10D 62/121* (2025.01); *H10D 84/0167* (2025.01); *H10D 84/017* (2025.01);
(Continued)

(58) Field of Classification Search
None
See application file for complete search history.

(56) References Cited

U.S. PATENT DOCUMENTS

| 11,367,722 | B2 * | 6/2022 | Lilak | H10D 84/0177 |
| 2021/0098605 | A1 * | 4/2021 | Wang | H10D 62/151 |

(Continued)

*Primary Examiner* — Bilkis Jahan
(74) *Attorney, Agent, or Firm* — Oblon, McClelland, Maier & Neustadt, L.L.P.

(57) ABSTRACT

Aspects of the present disclosure provide a self-aligned microfabrication method, which can include providing a substrate having vertically arranged first and second channel structures, forming first and second sacrificial contacts to cover ends of the first and second channel structures, respectively, covering the first and second sacrificial contacts with a fill material, recessing the fill material such that the second sacrificial contact is at least partially uncovered while the first sacrificial contact remains covered, replacing the second sacrificial contact with a cover spacer, removing a remaining portion of the first fill material, uncovering the end of the first channel structure, forming a first source/drain (S/D) contact to cover the end of the first channel structure, covering the first S/D contact with a second fill material, uncovering the end of the second channel structure, and forming a second S/D contact at the end of the second channel structure.

20 Claims, 26 Drawing Sheets

(51) Int. Cl.
*H10D 30/01* (2025.01)
*H10D 30/43* (2025.01)
*H10D 62/10* (2025.01)
*H10D 84/01* (2025.01)
*H10D 84/03* (2025.01)
*H10D 84/85* (2025.01)
*H10D 88/00* (2025.01)

(52) U.S. Cl.
CPC ....... *H10D 84/0186* (2025.01); *H10D 84/856* (2025.01); *H10D 88/01* (2025.01)

(56) References Cited

U.S. PATENT DOCUMENTS

2021/0296184 A1* 9/2021 Xie ...................... H10D 30/014
2022/0052047 A1* 2/2022 Xie .................... H10D 84/0167

* cited by examiner

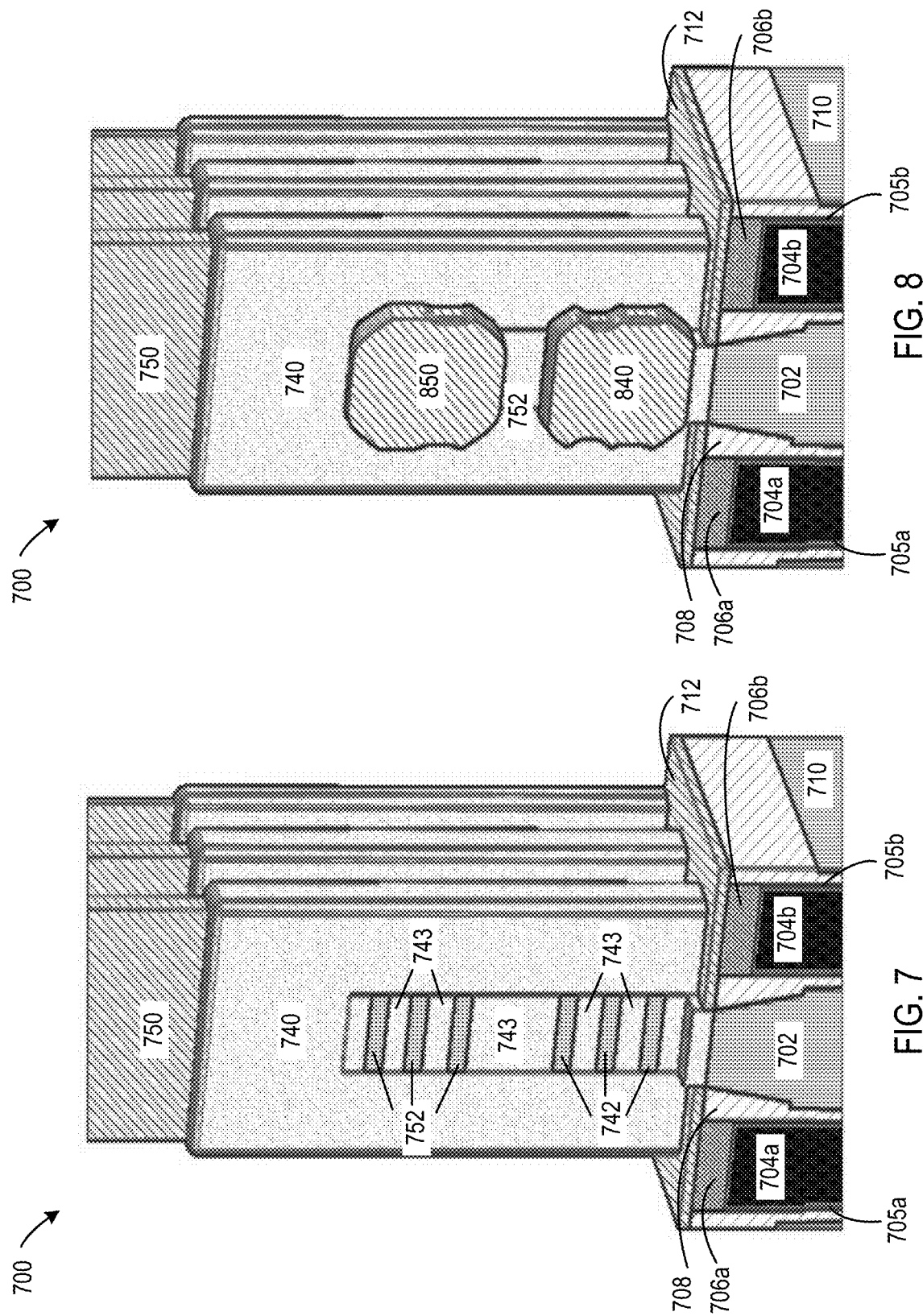

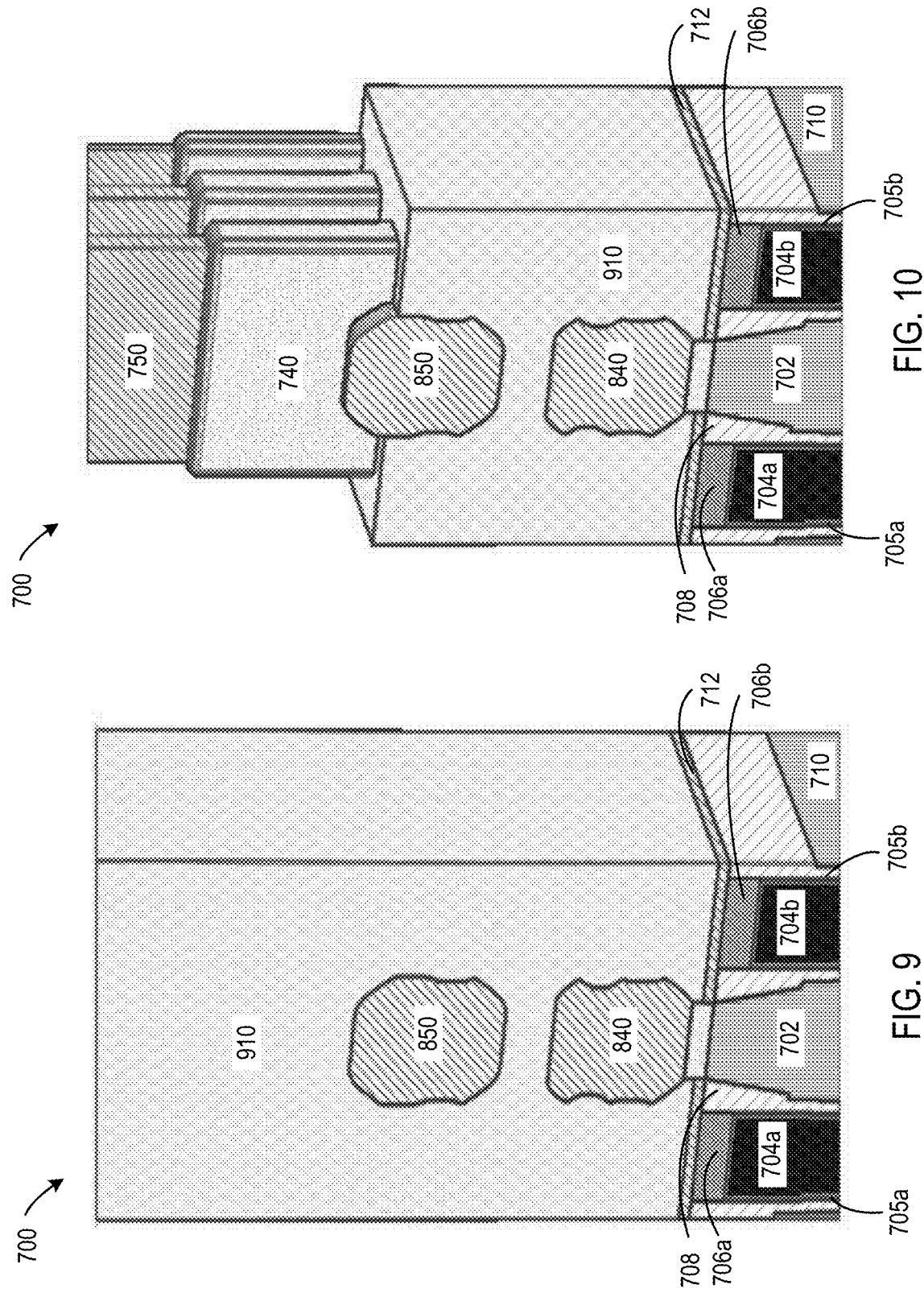

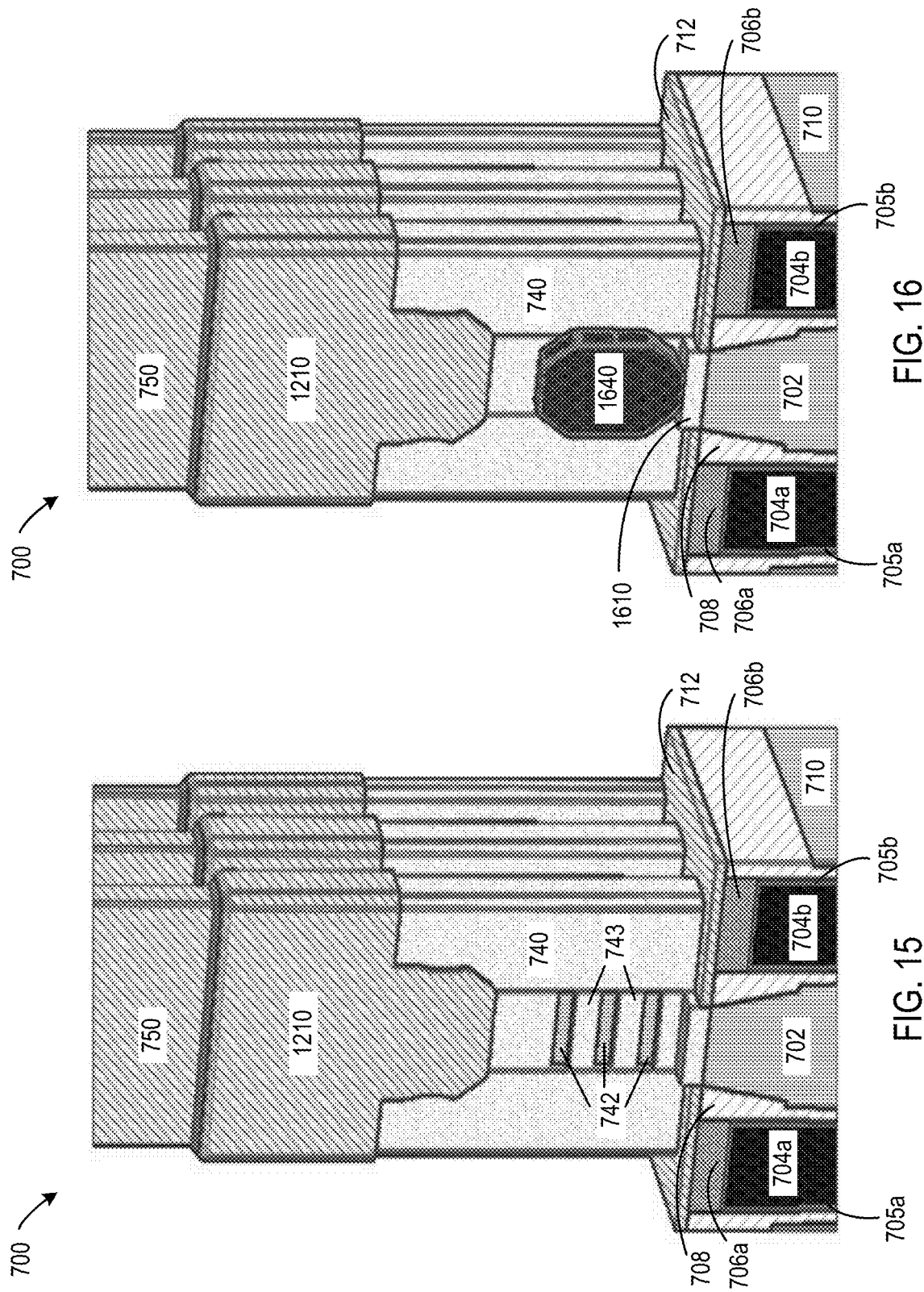

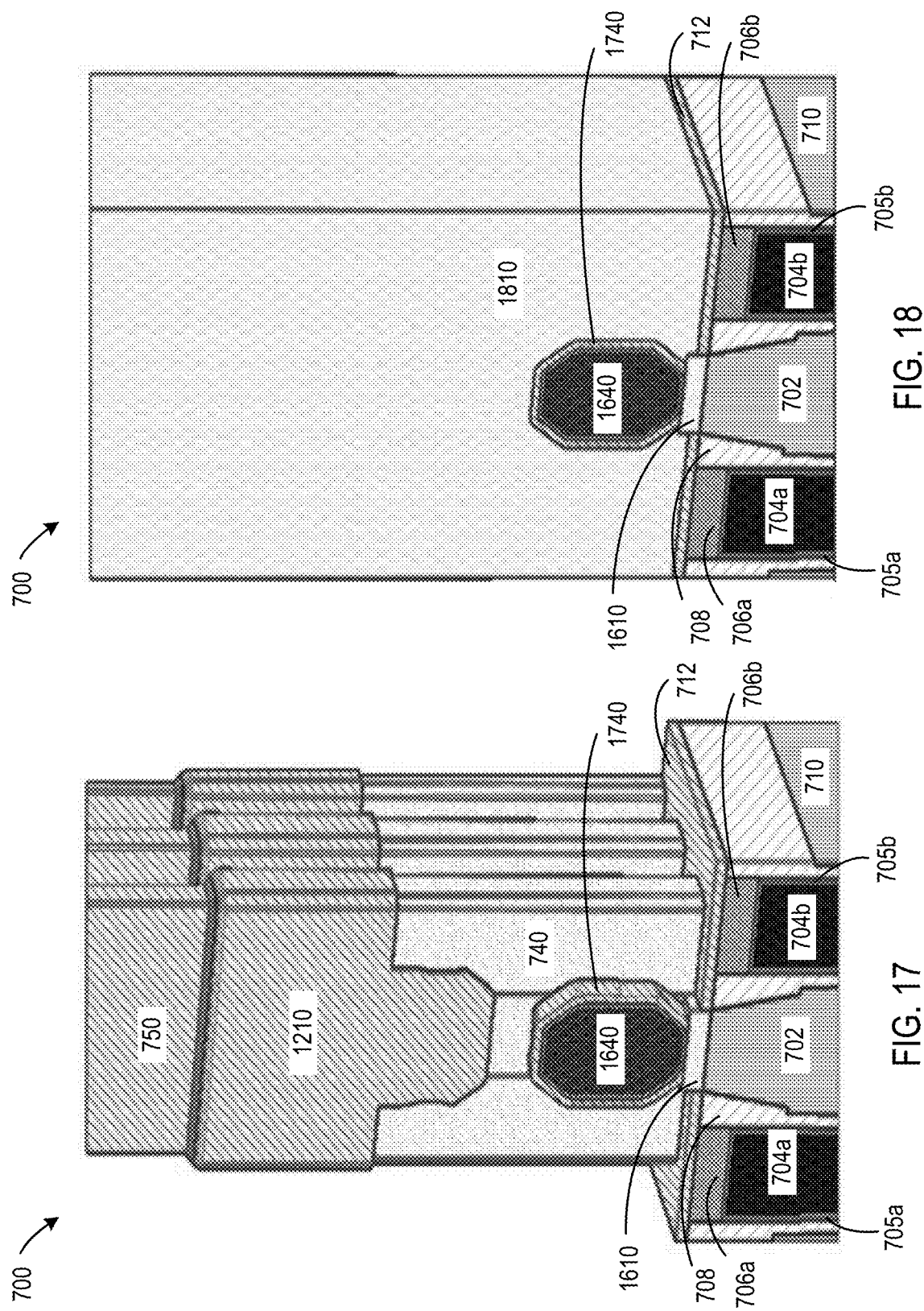

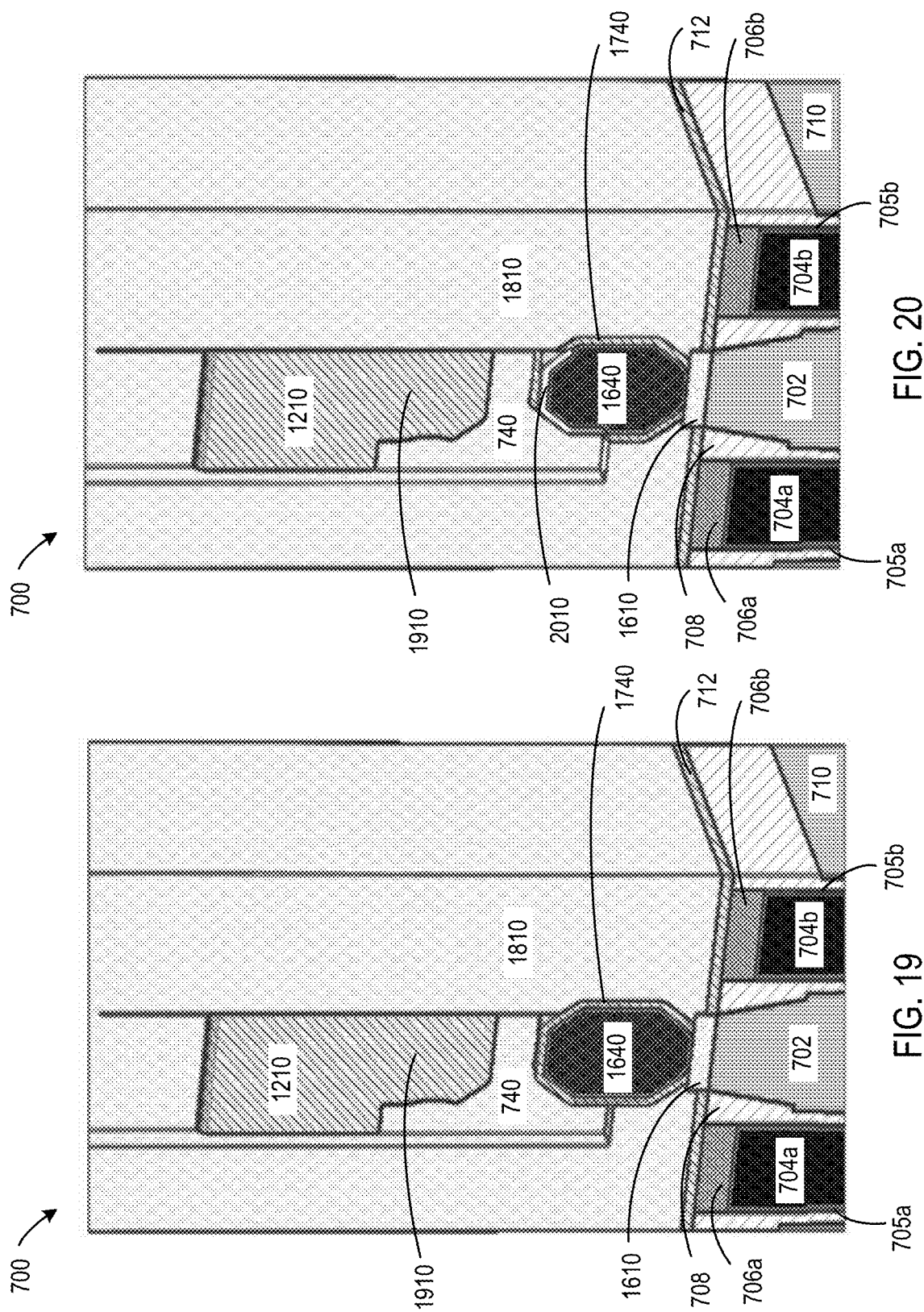

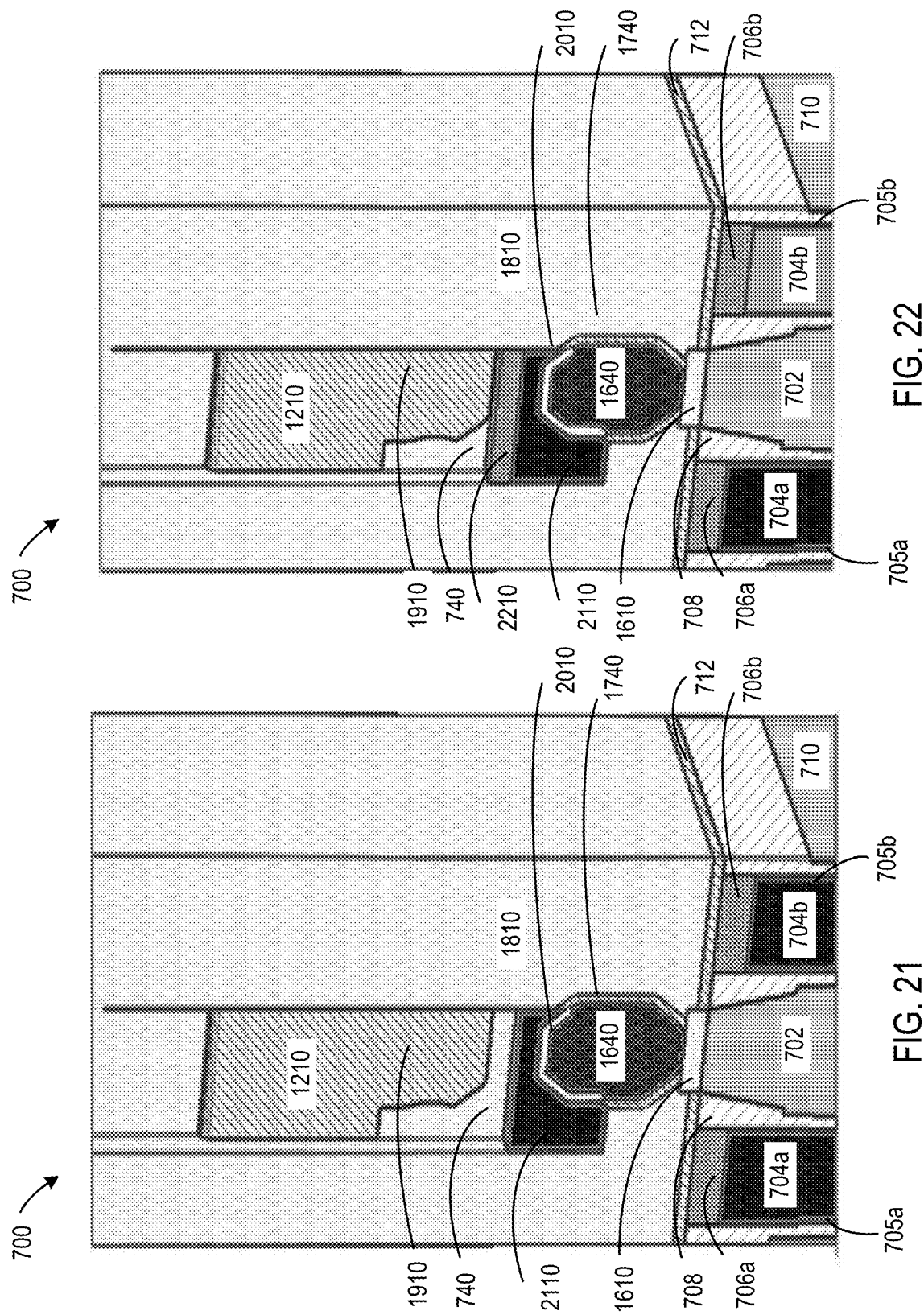

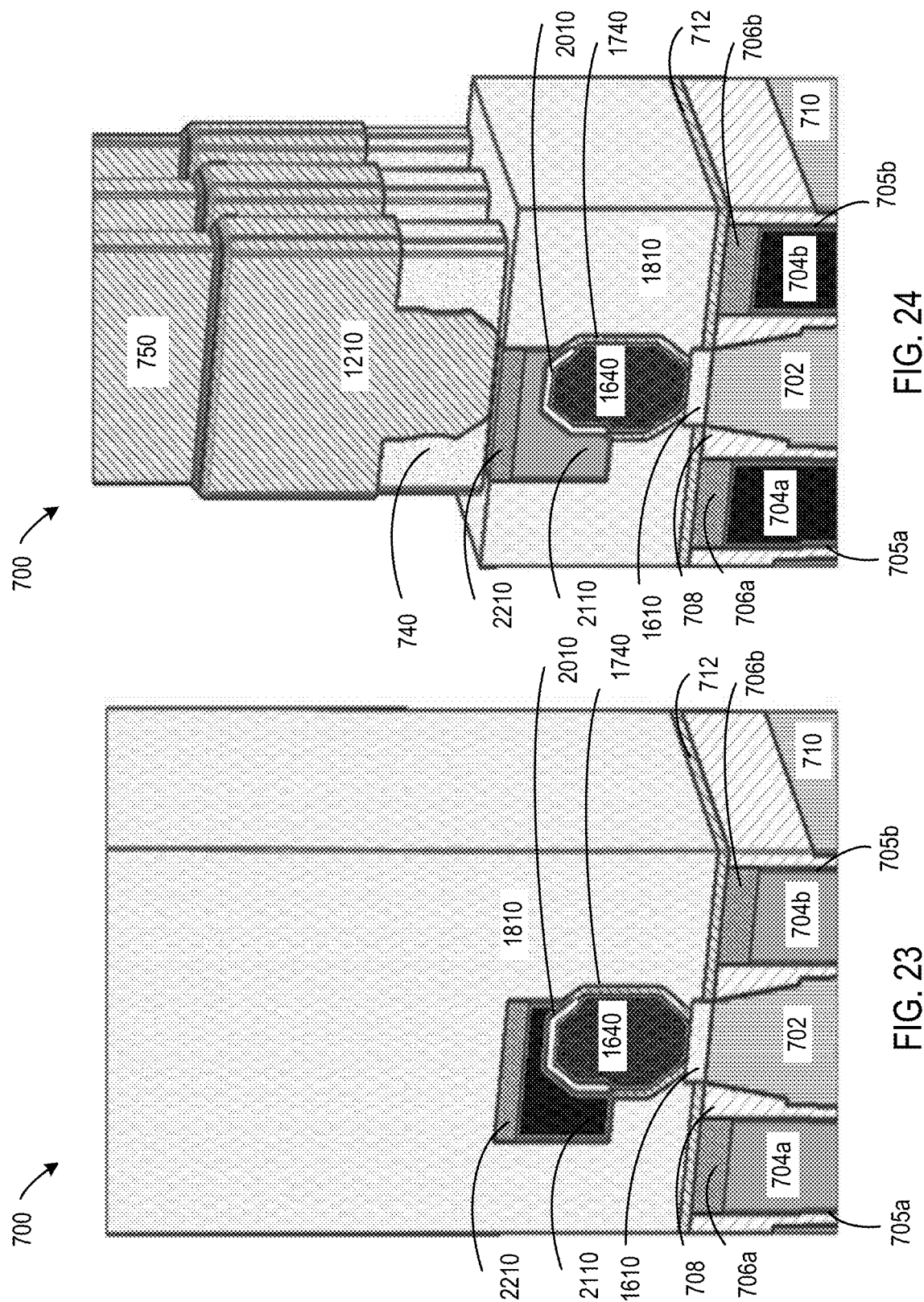

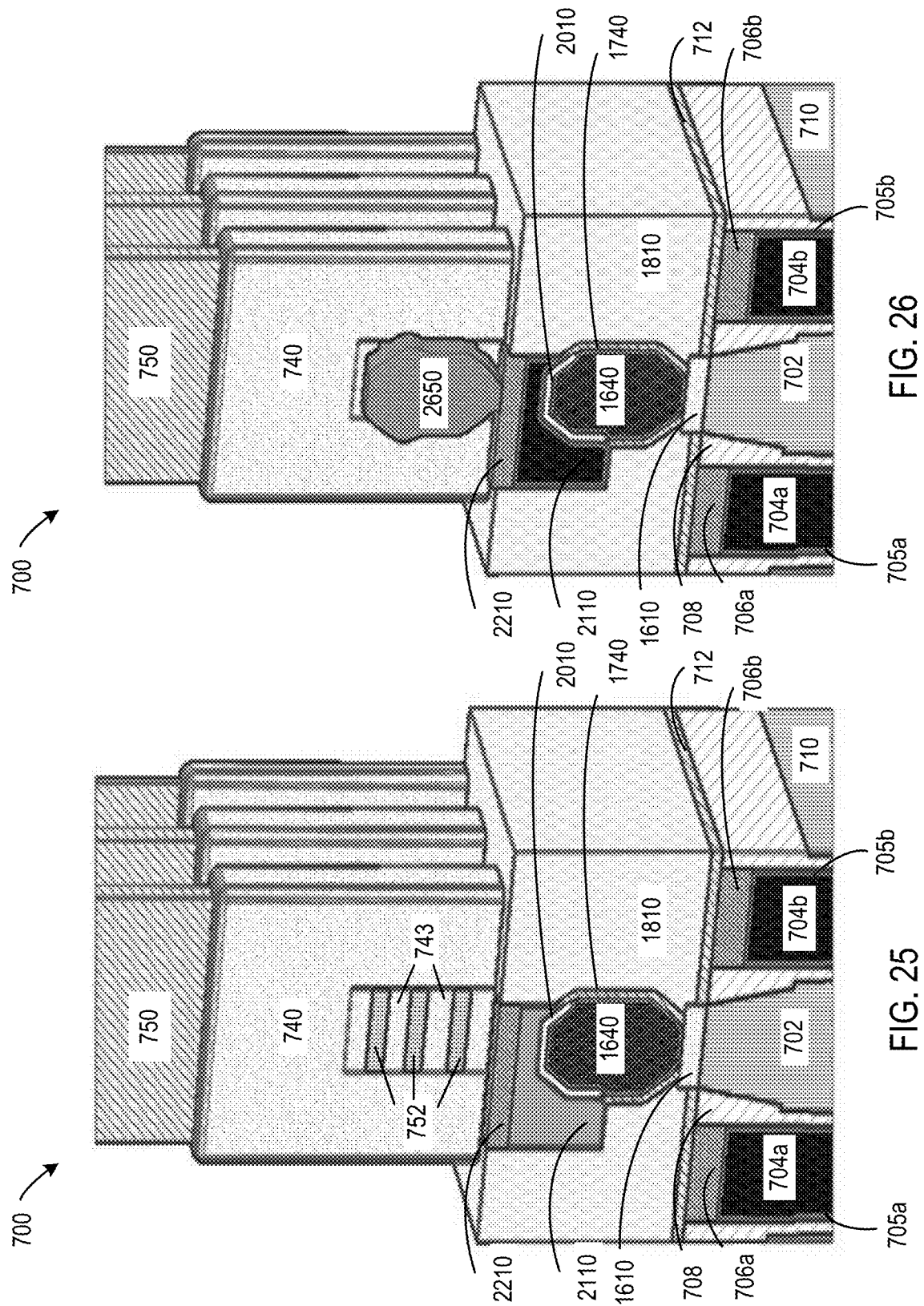

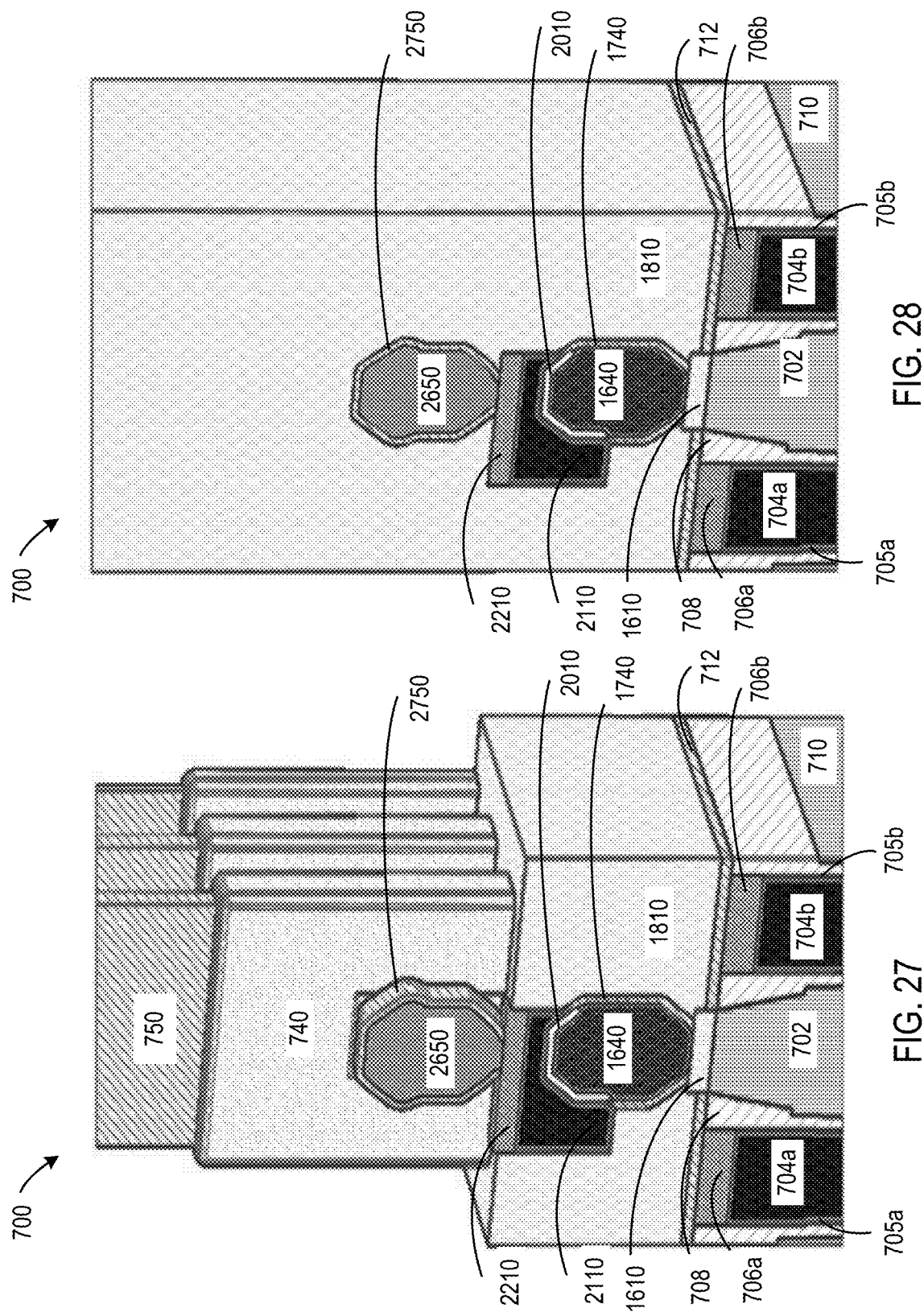

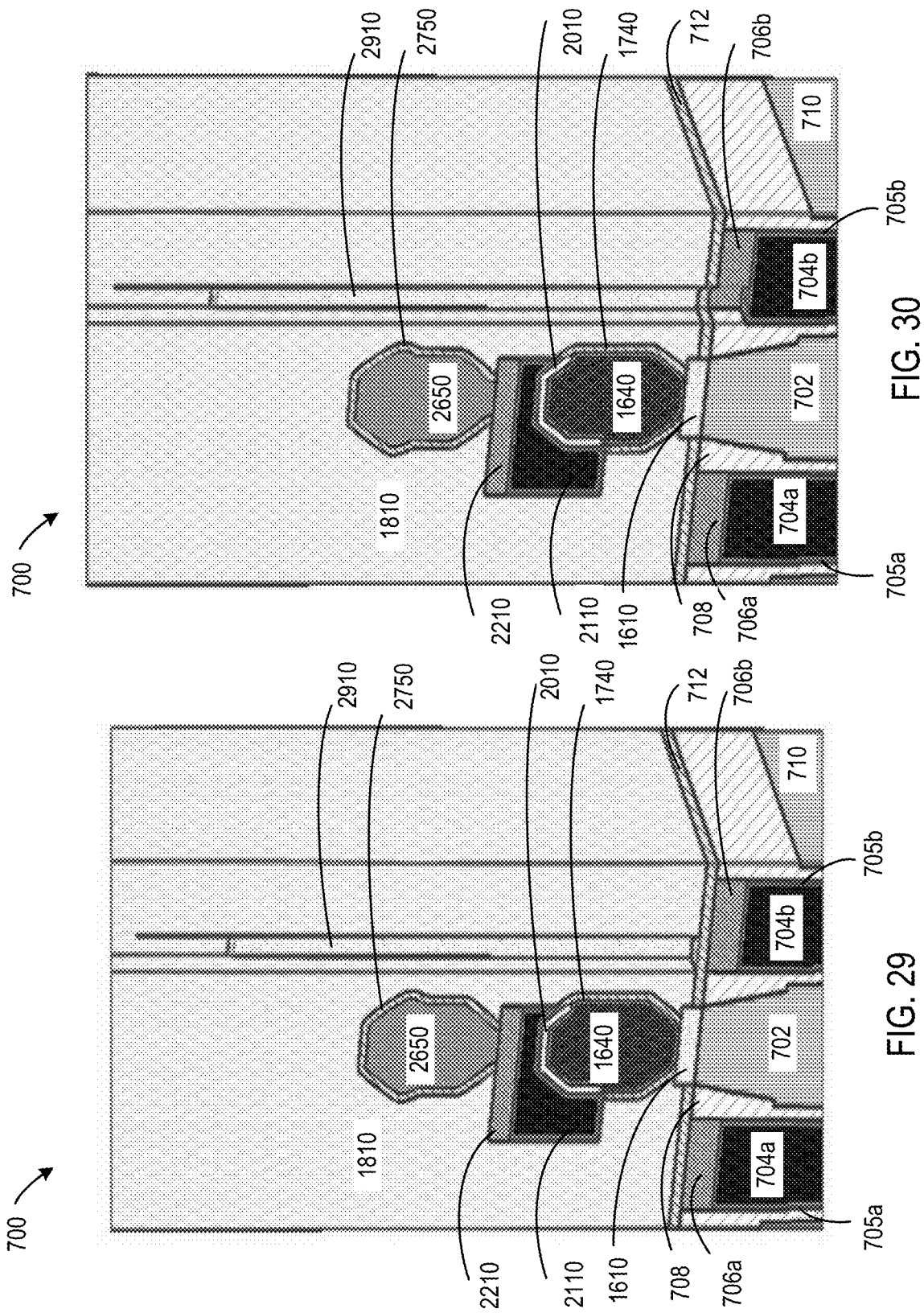

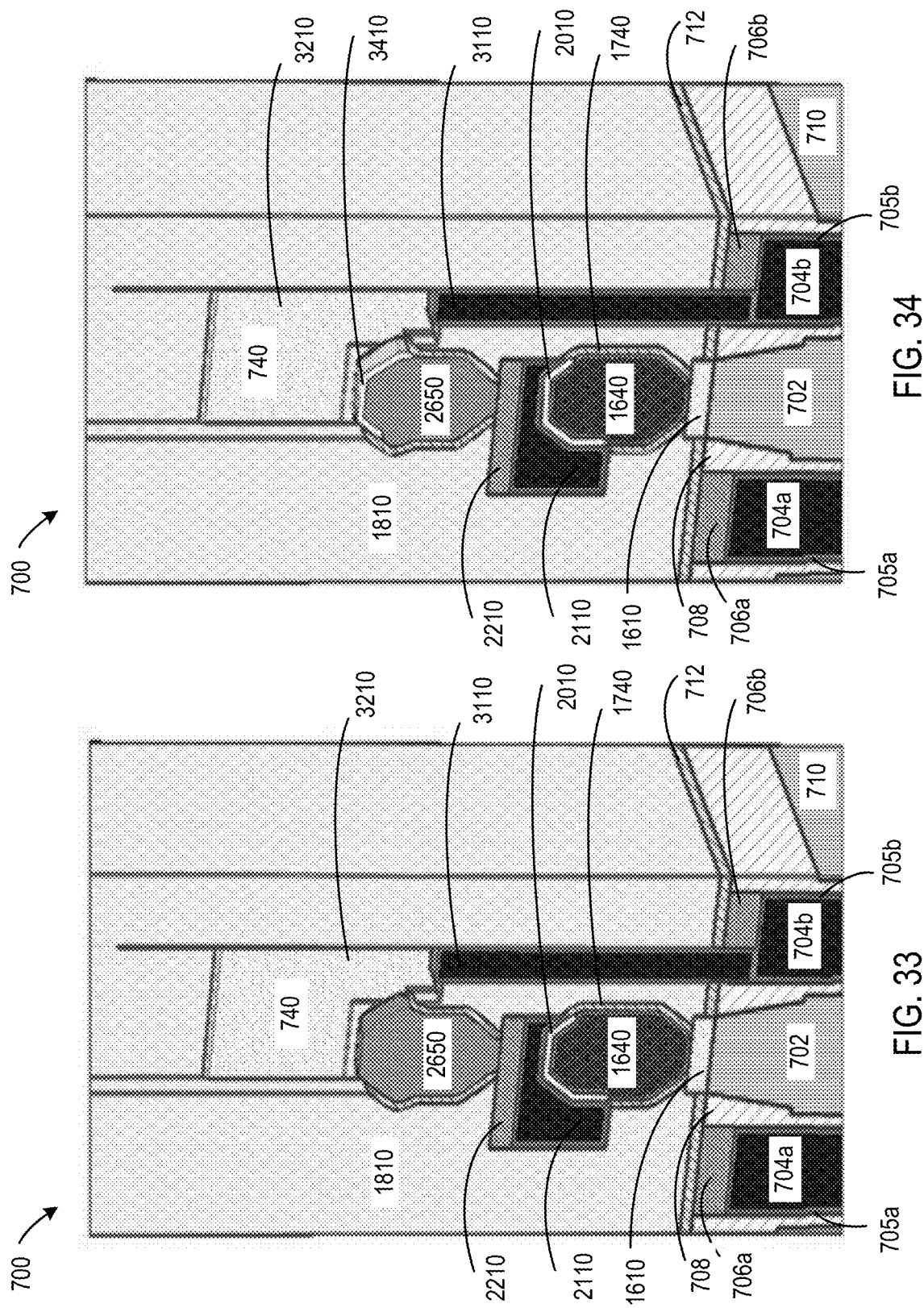

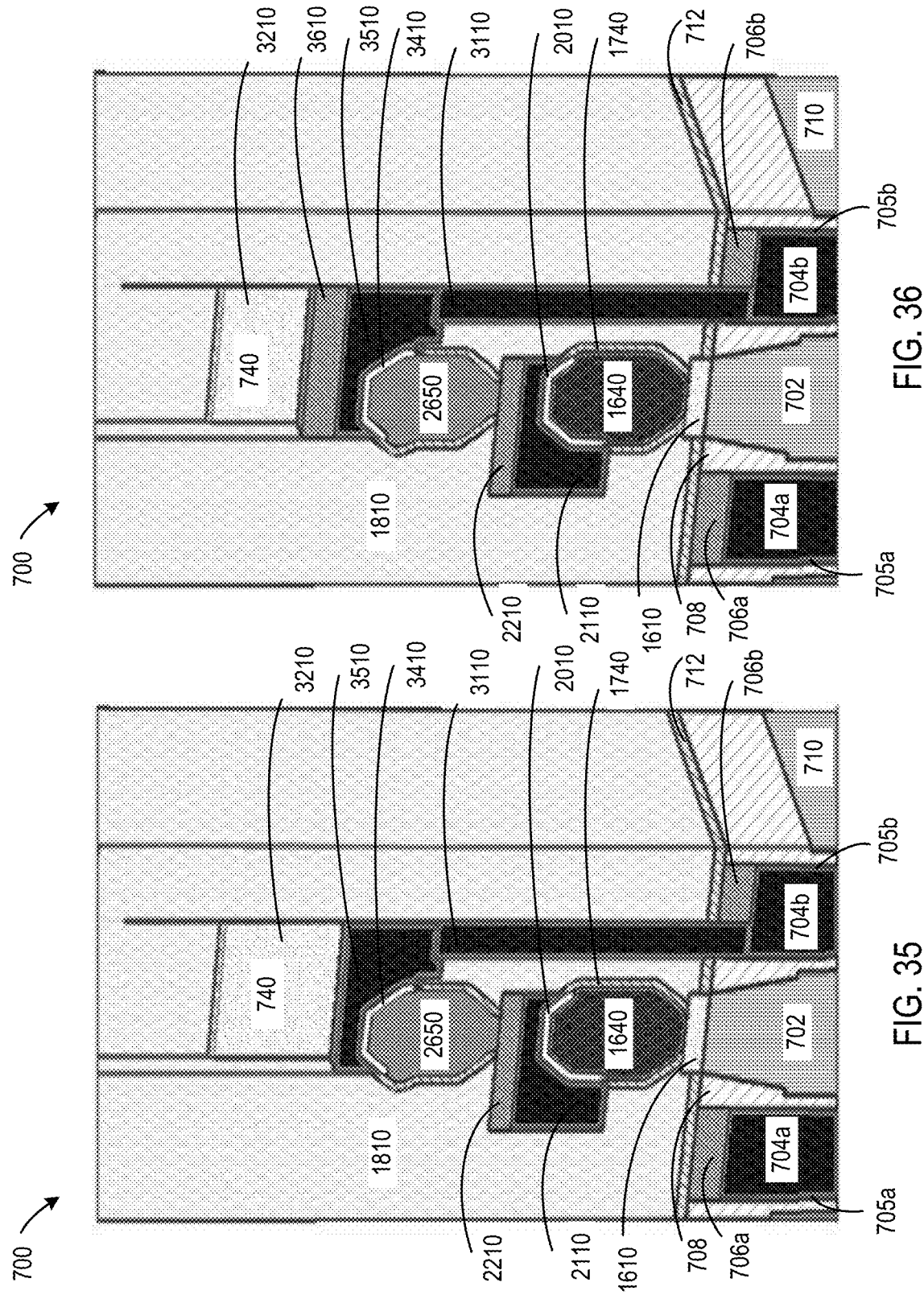

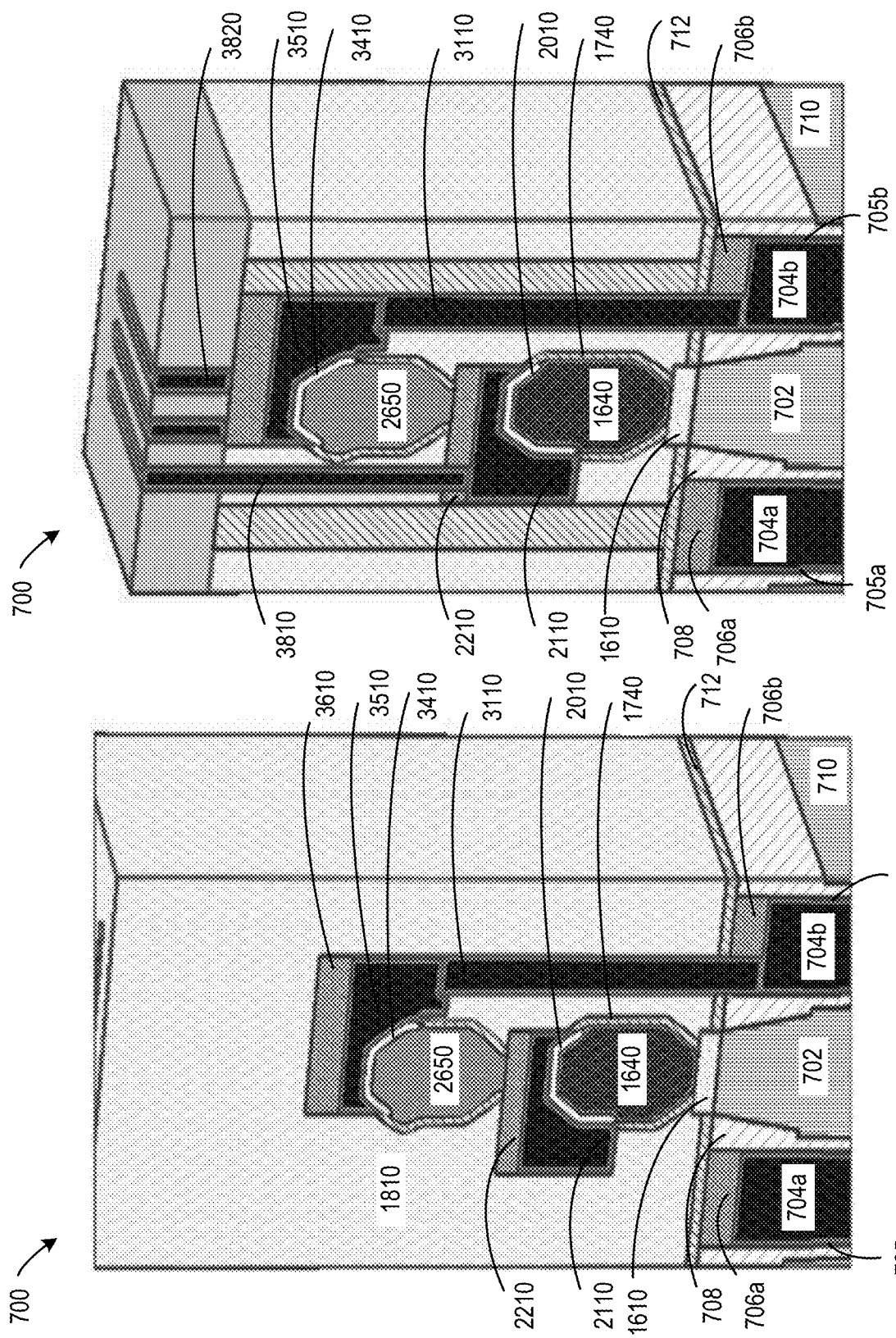

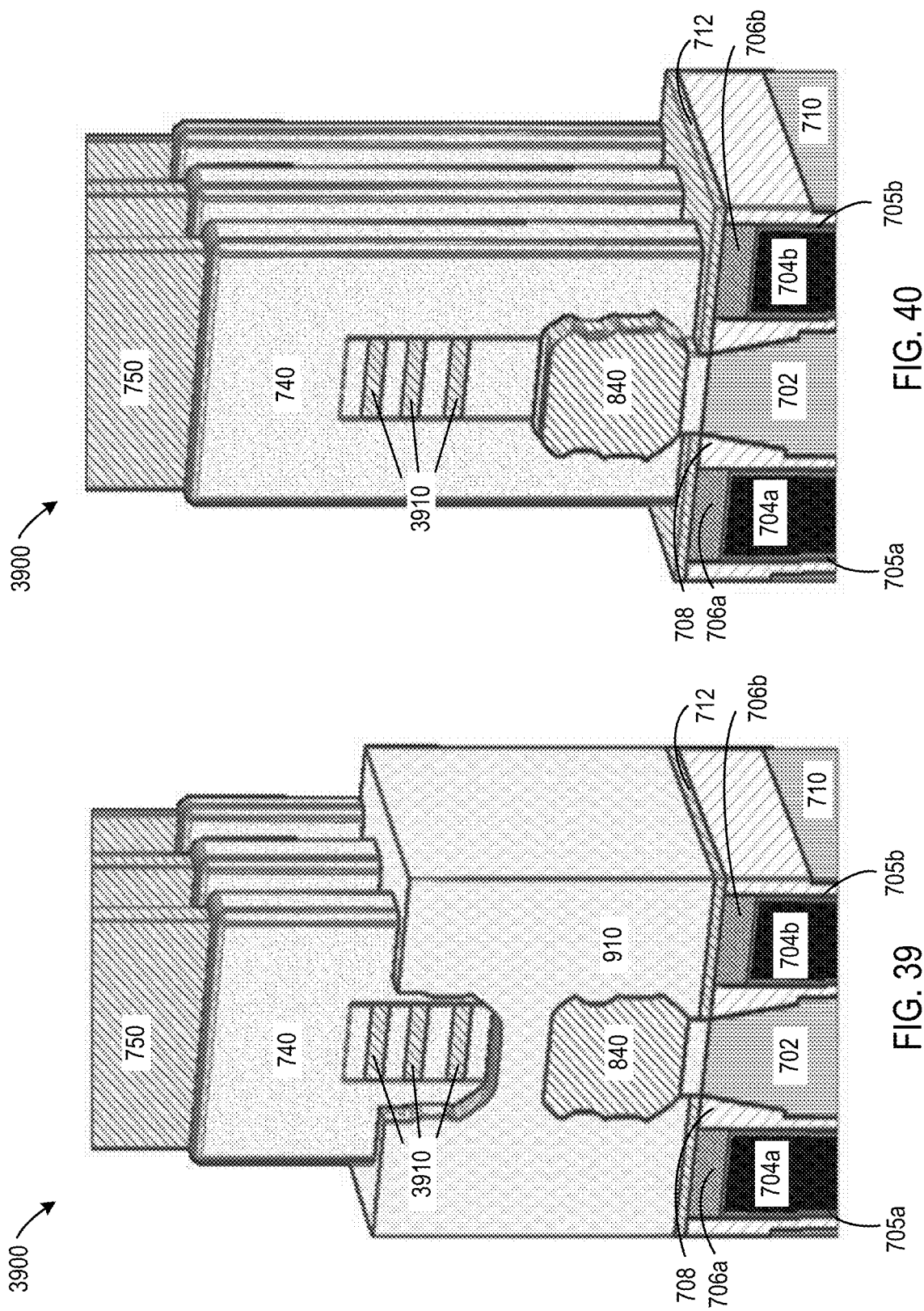

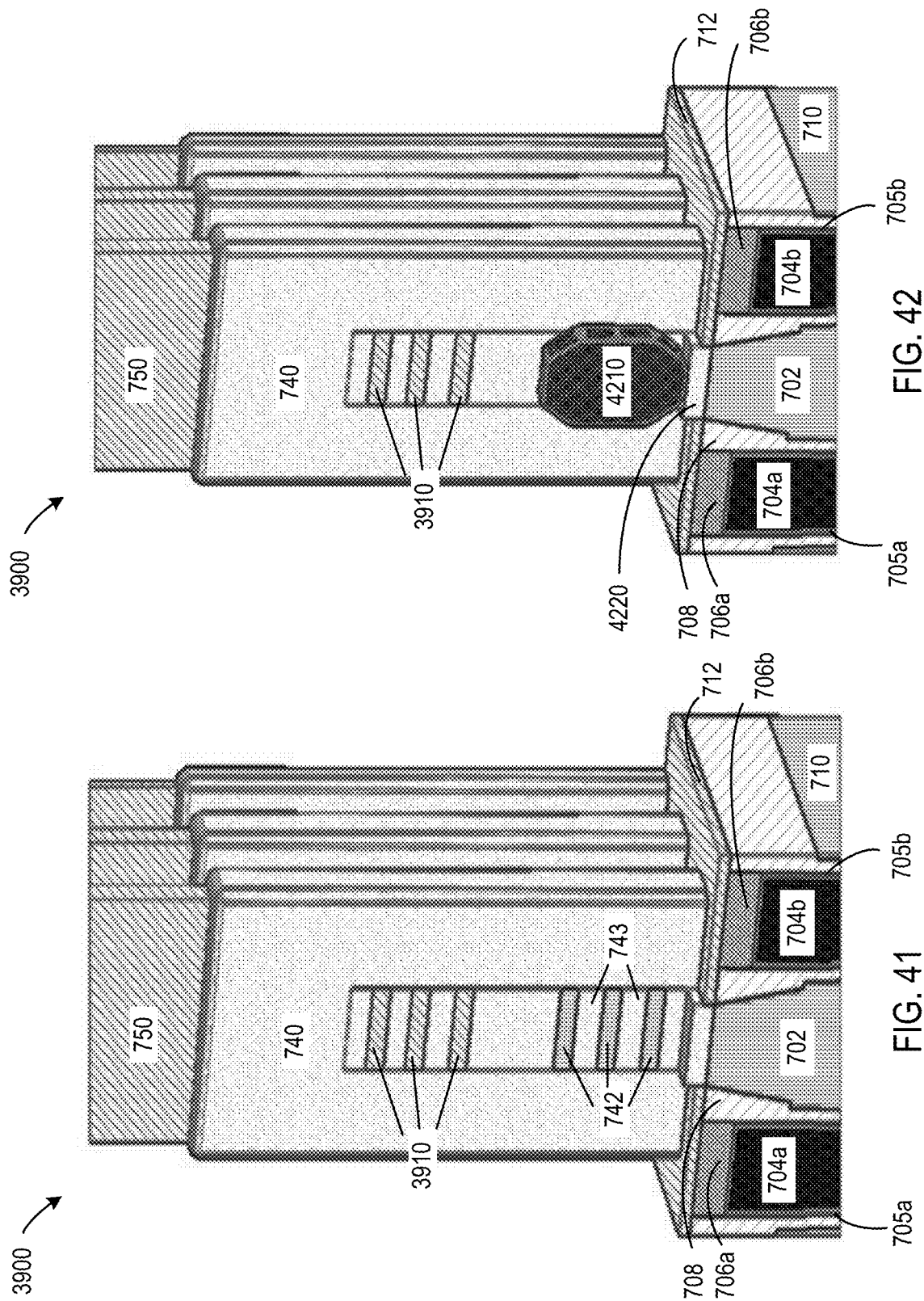

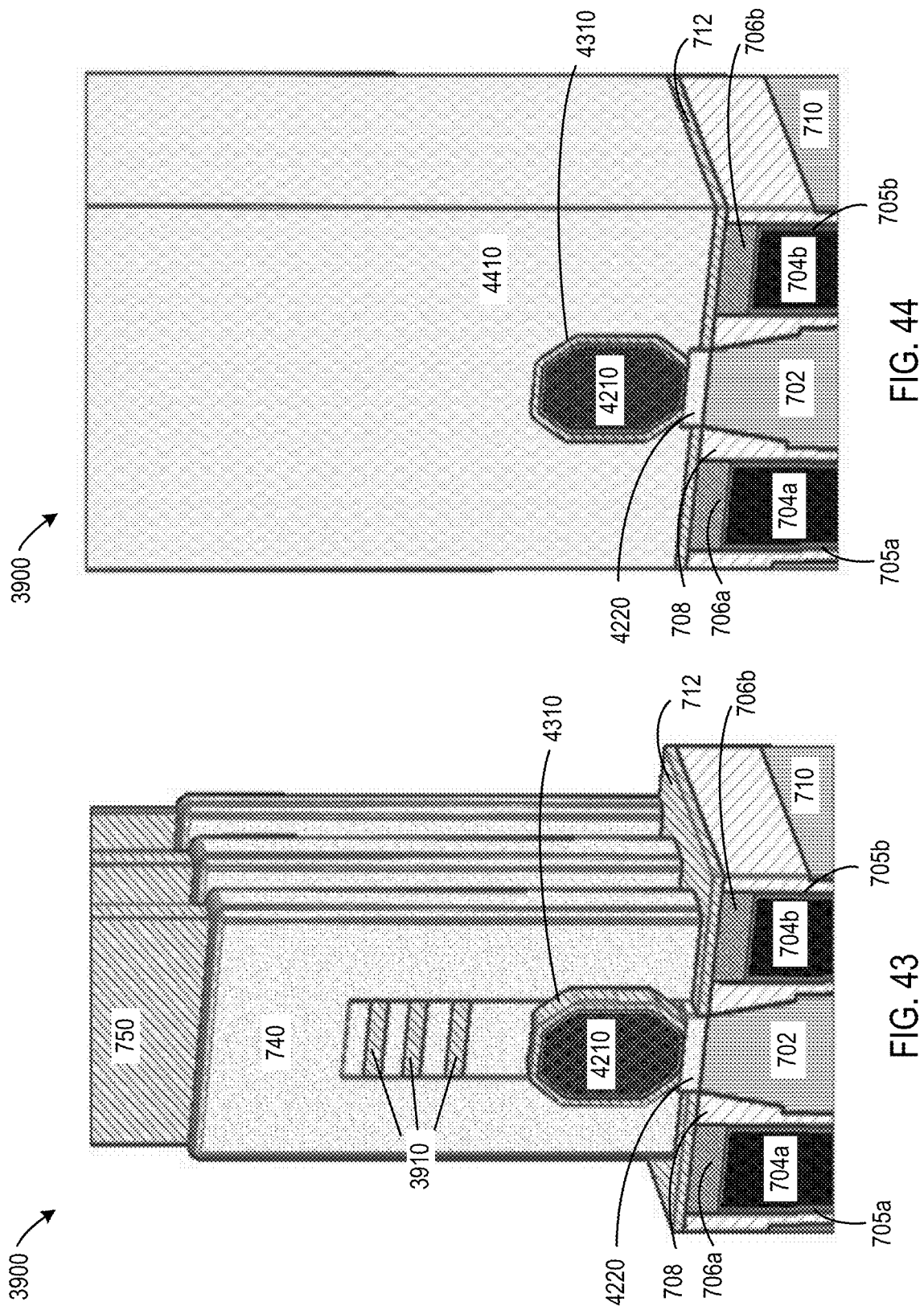

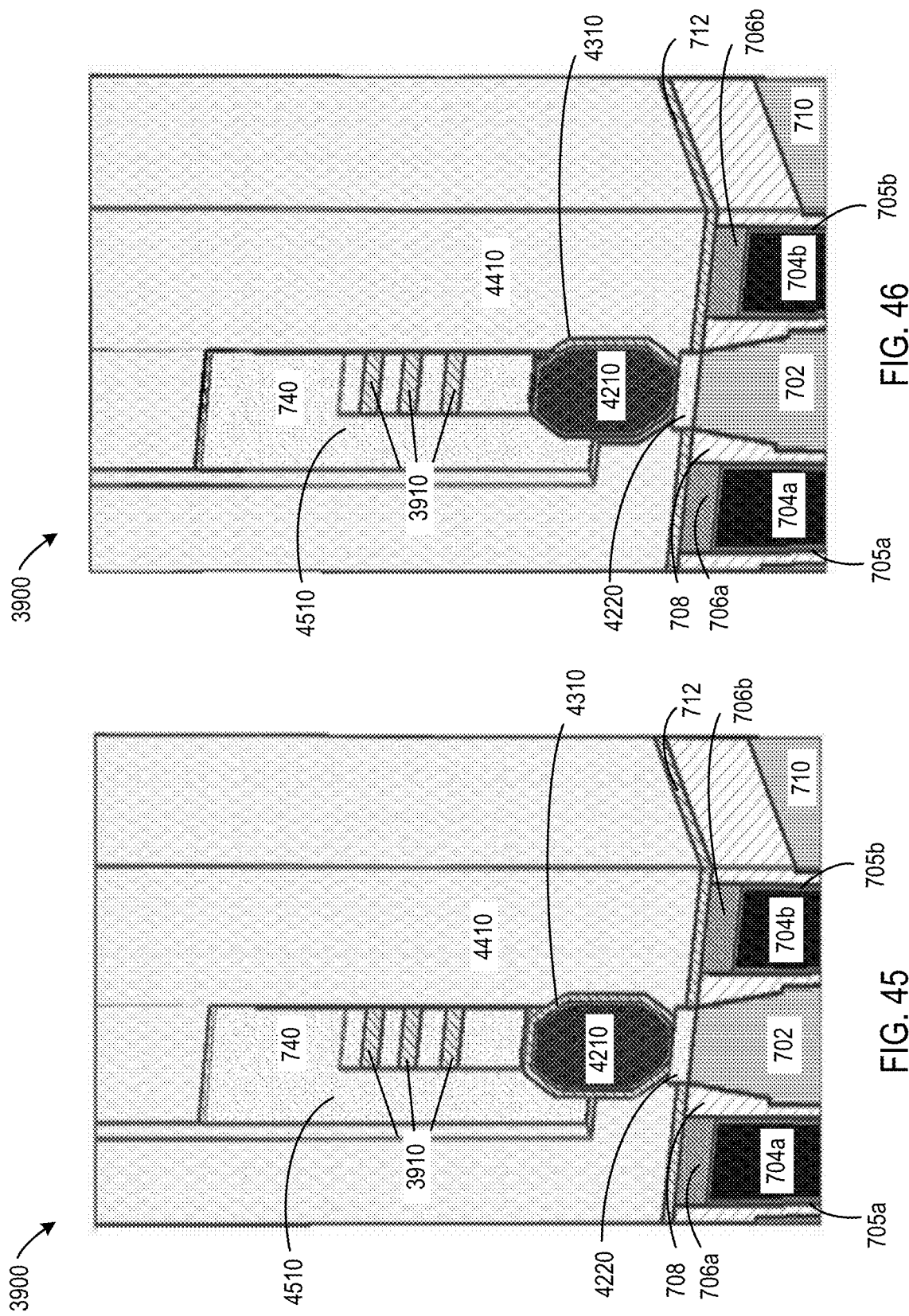

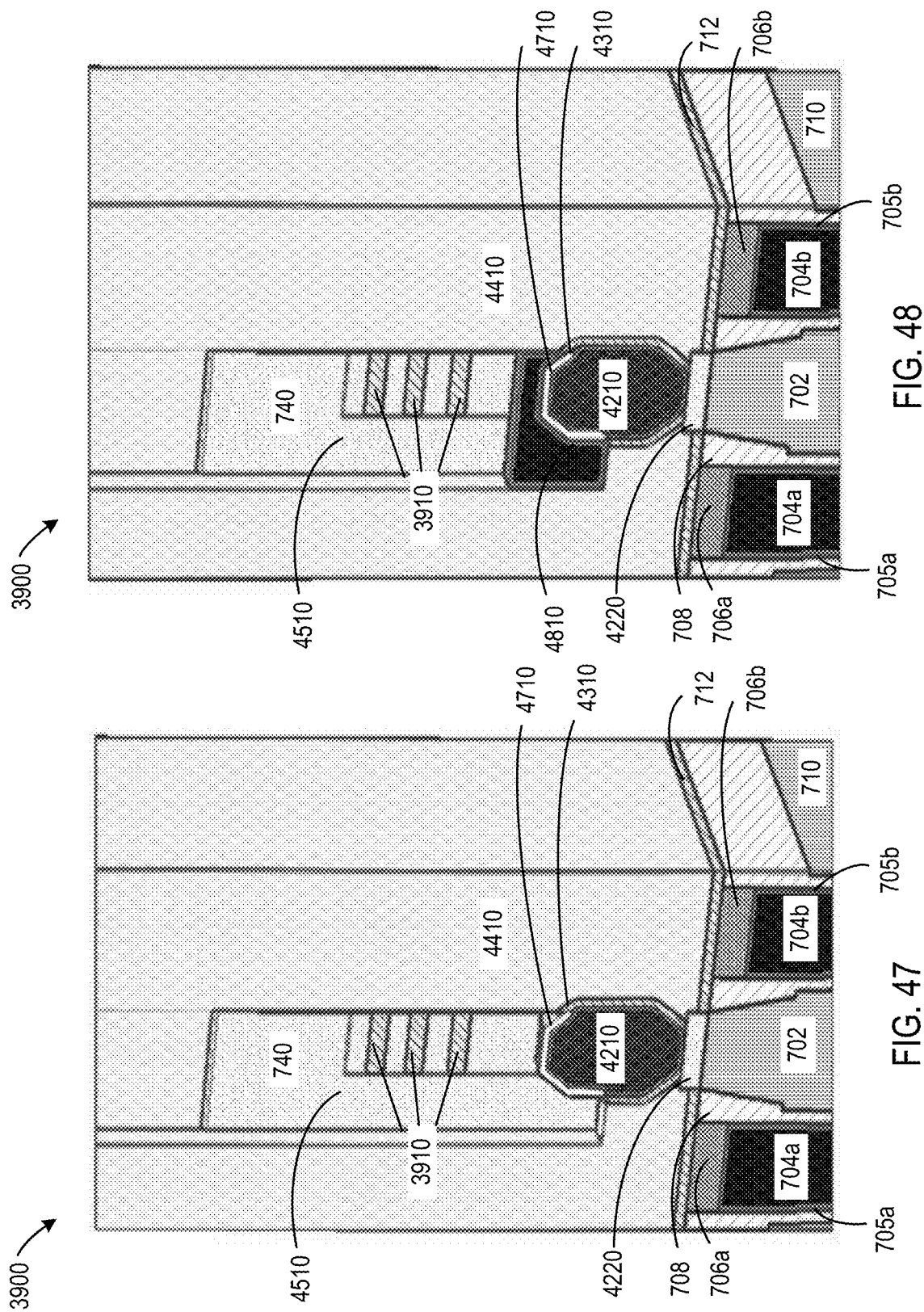

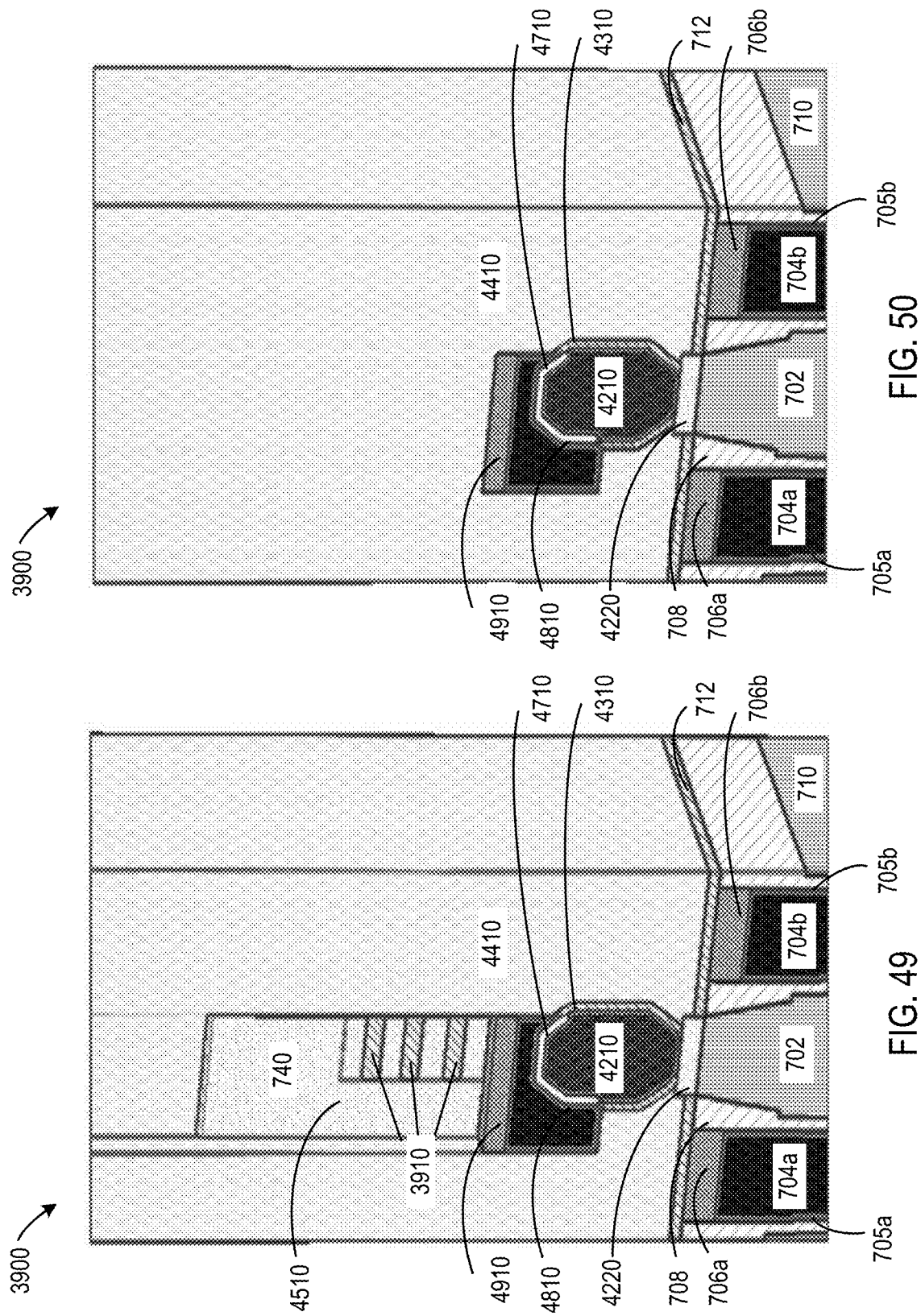

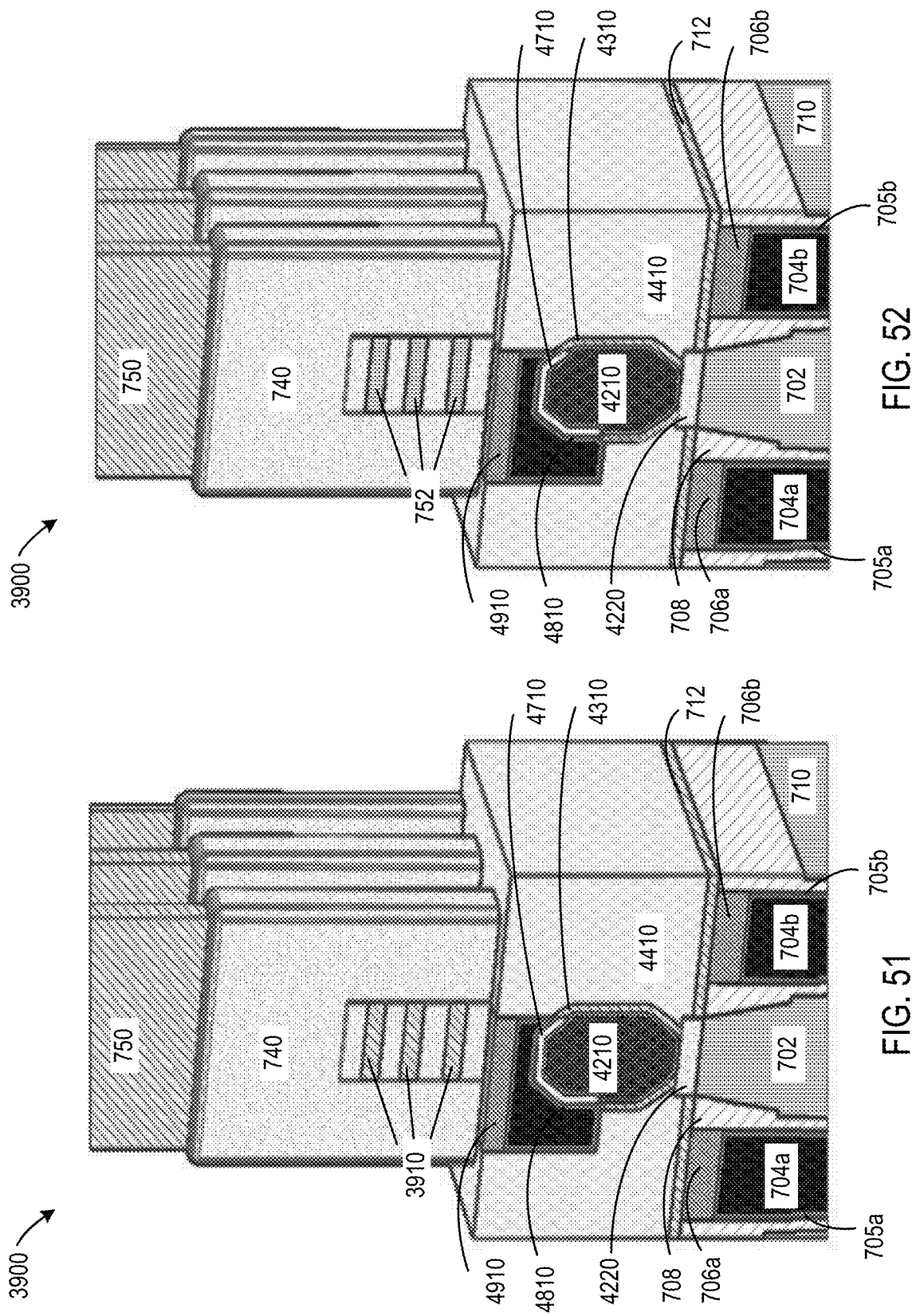

SELF-ALIGNED METHOD FOR VERTICAL RECESS FOR 3D DEVICE INTEGRATION

INCORPORATION BY REFERENCE

This present disclosure claims the benefit of U.S. Provisional Application No. 63/228,473, entitled "Self-Aligned Method for Vertical Recess for 3D Device Integration" filed on Aug. 2, 2021, which is incorporated herein by reference in its entirety.

FIELD OF THE PRESENT DISCLOSURE

The present disclosure relates generally to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

Aspects of the present disclosure provide a method for self-aligned microfabrication. For example, the method can include providing a substrate having a first channel structure formed thereon and a second channel structure formed over the first channel structure, forming a first sacrificial contact and a second sacrificial contact to cover ends of the first channel structure and the second channel structure, respectively, covering the first sacrificial contact and the second sacrificial contact with a first fill material, recessing a portion of the first fill material such that the second sacrificial contact is at least partially uncovered while the first sacrificial contact remains covered, replacing the second sacrificial contact with a cover spacer so that the end of the second channel structure is covered by the cover spacer, removing a remaining portion of the first fill material, removing the first sacrificial contact to uncover the end of the first channel structure, forming a first source/drain (S/D) contact to cover the end of the first channel structure, covering the first S/D contact with a second fill material, removing the cover spacer to uncover the end of the second channel structure, and forming a second S/D contact at the end of the second channel structure.

In an embodiment, at least one of the first channel structure and the second channel structure can include one or more nanosheets arranged in a vertical stack and separated from one another vertically, and a corresponding one of the first sacrificial contact and the second sacrificial contact that covers the at least one of the first channel structure and the second channel structure covers all of the nanosheets. In another embodiment, the first sacrificial contact and the second sacrificial contact can be separated from each other.

In an embodiment, at least one of the first fill material and the second fill material can include pre-metallization dielectric (PMD). In another embodiment, at least one of the first sacrificial contact and the second sacrificial contact can be un-doped.

In an embodiment, the method can further include transferring an interconnect trench into the second fill material with stop once the first S/D contact is uncovered, and forming within the interconnect trench first interconnect over the first S/D contact. In another embodiment, the method can further include forming a first silicide over the first S/D contact, wherein the first interconnect is formed over the first silicide. In some other embodiments, the method can further include forming a first contact etch stop layer (CESL) over the first S/D contact, wherein the second fill material further covers the first CESL, and transferring an interconnect trench into the second fill material with stop once the first S/D contact is uncovered includes transferring an interconnect trench into the second fill material with stop once a portion of the first CESL is uncovered, and removing the portion of the first CESL to uncover the first S/D contact. For example, the first CESL and the second fill material are etch-selective. In various embodiments, the method can further include forming a first interconnect cap overtop the first interconnect.

In an embodiment, the first fill material and the second sacrificial contact can be etch-selective. For example, the first fill material can include dielectric, and the second sacrificial contact can include SiGe.

In an embodiment, the first sacrificial contact and the first channel structure can be etch-selective. For example, the first sacrificial contact can include SiGe, and the first channel structure can include Si. As another example, the SiGe of the first sacrificial contact can have a Ge content that is set such that maximum selectivity is achieved so that there is no damage or unintended etching of the first channel structure when the first sacrificial contact is removed.

In an embodiment, the method can further include laterally recessing the uncovered end of the first channel structure to form a contact extension region, wherein the first S/D contact is formed in the contact extension region. In another embodiment, the first fill material and the second fill material can be etch-selective with respect to the cover spacer.

Aspects of the present disclosure also disclose another method for self-aligned microfabrication. For example, the method can include providing a substrate having a first channel structure formed thereon and a second channel structure formed over the first channel structure, forming a first sacrificial contact and a second sacrificial contact to cover ends of the first channel structure and the second channel structure, respectively, covering the first sacrificial contact and the second sacrificial contact with a first fill material, recessing a portion of the first fill material such that the second sacrificial contact is at least partially uncovered while the first sacrificial contact remains covered, removing the second sacrificial contact to uncover the end of the second channel structure, laterally recessing the uncovered end of the second channel structure, covering the recessed end of the second channel structure with a blocking material, removing a remaining portion of the first fill material, removing the first sacrificial contact to uncover the end of the first channel structure, forming a first S/D contact to cover the end of the first channel structure, covering the first S/D contact with a second fill material, removing the blocking material to uncover the recessed end of the second channel structure, and forming a second S/D contact at the uncovered recessed end of the second channel structure.

In an embodiment, the first fill material and the second sacrificial contact can be etch-selective. In another embodiment, the first sacrificial contact and the first channel structure can be etch-selective.

Note that this summary section does not specify every embodiment and/or incrementally novel aspect of the present disclosure or claimed disclosure. Instead, this summary only provides a preliminary discussion of different embodiments and corresponding points of novelty over conventional techniques. For additional details and/or possible perspectives of the present disclosure and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein:

FIGS. 7-38 are schematic views illustrating an exemplary method for fabricating a semiconductor structure at various intermediate steps according to some embodiments of the present disclosure; and FIGS. 39-52 are schematic views illustrating another exemplary method for fabricating a semiconductor structure at various intermediate steps according to some embodiments of the present disclosure.

DETAILED DESCRIPTION

Figure 2:
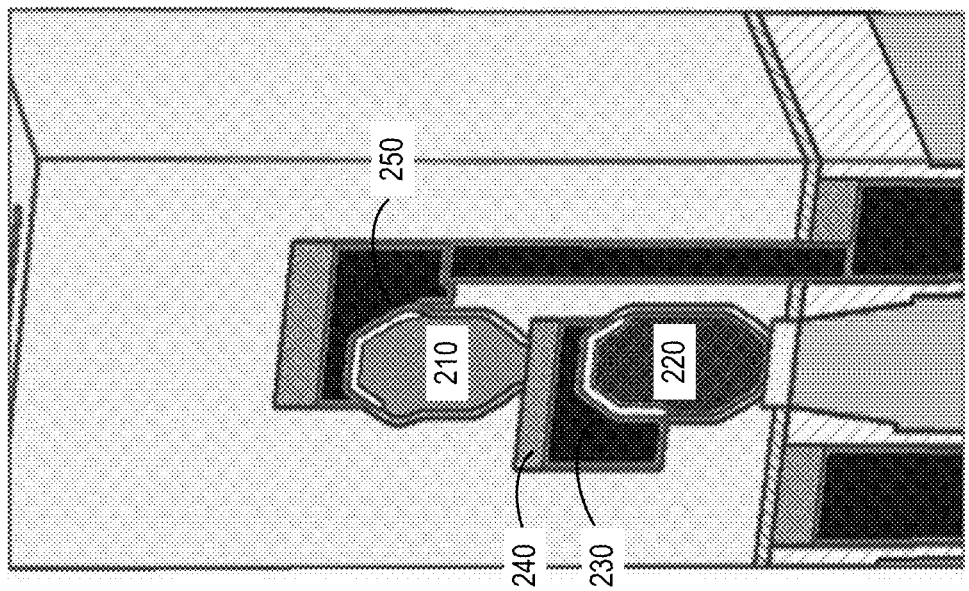
FIG. 2 shows the structures which need to fall within a 40 nm window.

The word "exemplary" is used herein to mean, "serving as an example, instance or illustration." Any embodiment of construction, process, design, technique, etc., designated herein as exemplary is not necessarily to be construed as preferred or advantageous over other such embodiments. Particular quality or fitness of the examples indicated herein as exemplary is neither intended nor should be inferred.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus (or device) in use or operation in addition to the orientation depicted in the figures. The apparatus (or device) may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of the present disclosure, it is intended that each of the concepts can be executed independently of each other or in combination with each other. Accordingly, the present disclosure can be embodied and viewed in many different ways.

Complimentary FET (CFET) logic and SRAM devices are comprised of standard cells in which each complimentary pair of semiconductor devices and transistors are vertically stacked overtop of one another in contrast to being positioned in a side-by-side configuration which is typically used to produce logic cells today for FINFET or gate-all-around (GAA) technologies. The CFET devices have a number of significant benefits over existing logic designs in that the PMOS/NMOS spacing, which has typically been a key limiter to area scaling of logic devices, can now be accomplished vertically which allows for very aggressive scaling of logic devices. Sharing of NMOS and PMOS outputs to a common signal track can now be accomplished through staggering of the bottom-tier and top-tier interconnects to provide this access, whereas for standard logic designs this requires routing to additional metal levels and provides a point of congestion as standard cells scale down to five signal tracks or even lower. CFET can also provide overall performance benefits resulting from the shorter wiring distances.

One of the challenges with such CFET devices is in the process integration in which specific devices must be made accessible for processing while other devices are kept contained and not accessible to processing at any given step in the integration flow. For the case of monolithic CFET in which the nanosheets or channels for both complimentary devices are co-existing during all of the wafer processing, it is beneficial to be able to work on either the NMOS device or PMOS device while not interfering with the its complimentary pair. Often this is done through the inclusion of cover spacers which will essentially block, or cover, the device which is to not be exposed or uncovered to any processing being done to its complimentary pair. In order to place such cover spacers, a means by which to height-set the position of the cover spacer must be done. This is currently proposed to be done through a method in which a material is deposited onto an integrated wafer in which there is a defined gate region and a defined contact or device region which at this point in the integration flow exists as a trench separating the adjacent gate regions. This material that is deposited is typically a pre-metallization dielectric (PMD) material such as silicon oxide. This PMD film is filled to a height that extends to the top of the cap, e.g., the replacement gate cap, that is existing over the gate region, with the filling height consisting of the sum of the gate structure itself as well as the replacement gate cap placed overtop the gate region. For a monolithic CFET device which contains three stacked nanosheets for NMOS and three stacked nanosheets for PMOS, this total height can easily exceed 300 nm.

To position the set level height of the cover spacer, this PMD film must be recessed to a height that exists in between the NMOS and PMOS device areas within this trench. Typically (as will be explained in more detail in the following paragraphs), the NMOS and PMOS separation area is set to approximately 40 nm. The actual final height of the recessed PMD film, however, must also account for other "features" existing within this NMOS/PMOS separation area. Such features are described as follows.

Figure 1:
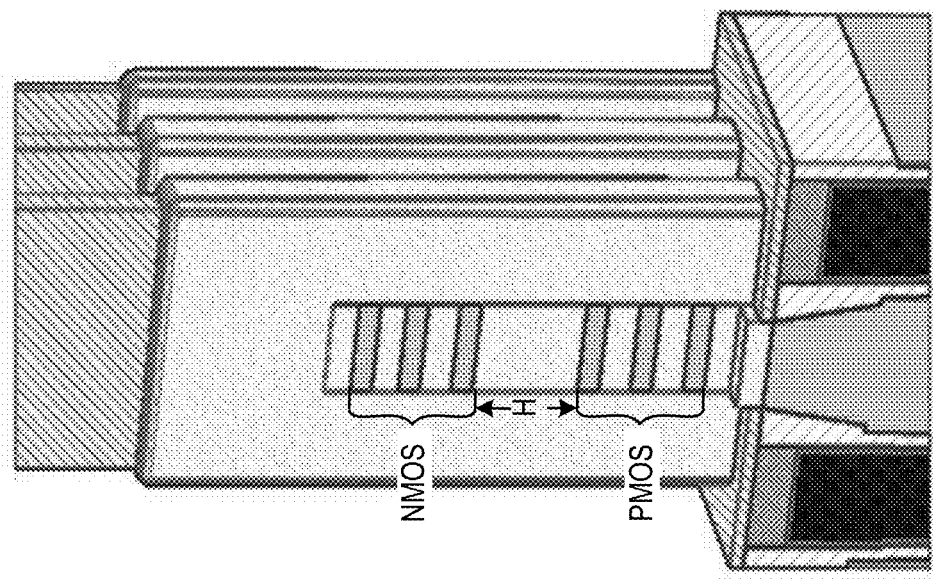
FIG. 1 shows a simplified cross-sectional view of a semiconductor segment.

FIG. 1 shows the position of the NMOS set of nanosheets (3 top most silicon nanosheets) and the PMOS set of nanosheets (3 bottom most silicon nanosheets). The height (or window) H between the top-face of the topmost PMOS nanosheet and the corresponding bottom-face of the bottom-most NMOS nanosheet is approximately 40 nm.

FIG. 2 shows the structures which need to fall within this 40 nm window and include the bottom-most face of the NMOS source and drain (S/D) contact 210, the top-most face of the PMOS S/D contact 220, the PMOS interconnect 230 overtop the PMOS S/D contact 220, and the interconnect cap 240 between NMOS and PMOS that separates the NMOS S/D contact 210 and interconnect 250 and the PMOS S/D contact 220 and interconnect 230.

In an embodiment, the true landing "window" of the etch-recessed PMD film is not 40 nm, but a number much smaller given that the PMOS S/D contact 220 may extend several nanometers above the top-most face of the PMOS nanosheets, and conversely the complimentary NMOS S/D contact 210 may extend several nanometers below the bottom-most face of the NMOS nanosheets. An example metal height of the PMOS interconnect 230 is typically 10 nm relative to the upper-most face of the PMOS S/D contact 220, and a minimum of 10 nm interconnect cap (or dielectric separation, e.g., the interconnect cap 240) is needed between the PMOS interconnect 230 and the bottom-most face of the NMOS S/D contact 210. Therefore, the etch recess of the PMD film must actually fall within a very limited window of approximately 10 nm within the NMOS/PMOS vertical space.

Figure 3:
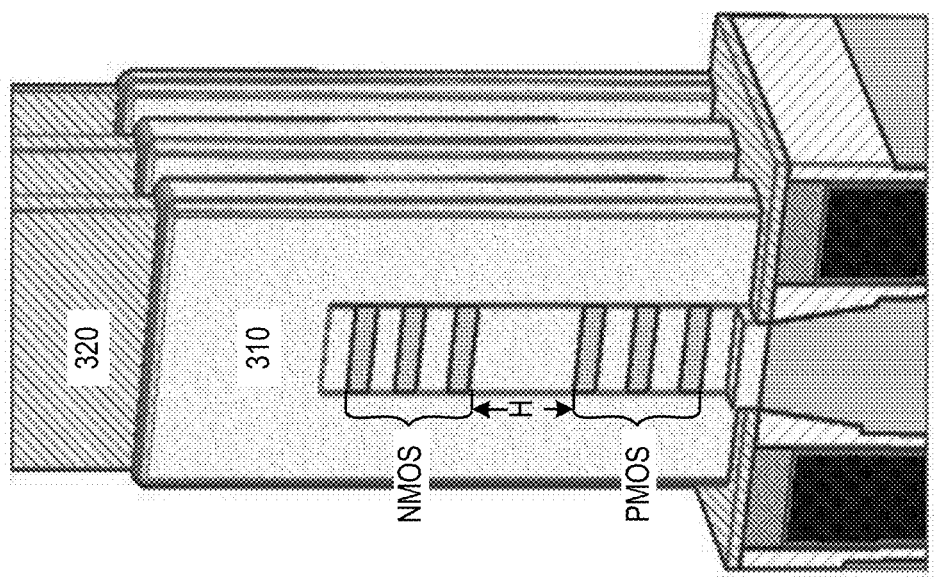
FIG. 3 shows the position of an NMOS set of nanosheets and a PMOS set of nanosheets.

FIG. 3 shows the position of the NMOS set of nanosheets (3 top most silicon nanosheets) and the PMOS set of nanosheets (3 bottom most silicon nanosheets). The height or window H between the top-face of the topmost PMOS nanosheet and the corresponding bottom-face of the bottom-most NMOS nanosheet is approximately 40 nm. FIG. 3 also shows a gate spacer 310 and a replacement gate cap 320. The NMOS set of nanosheets and the PMOS set of nanosheets are within the gate spacer 310.

Figure 4:
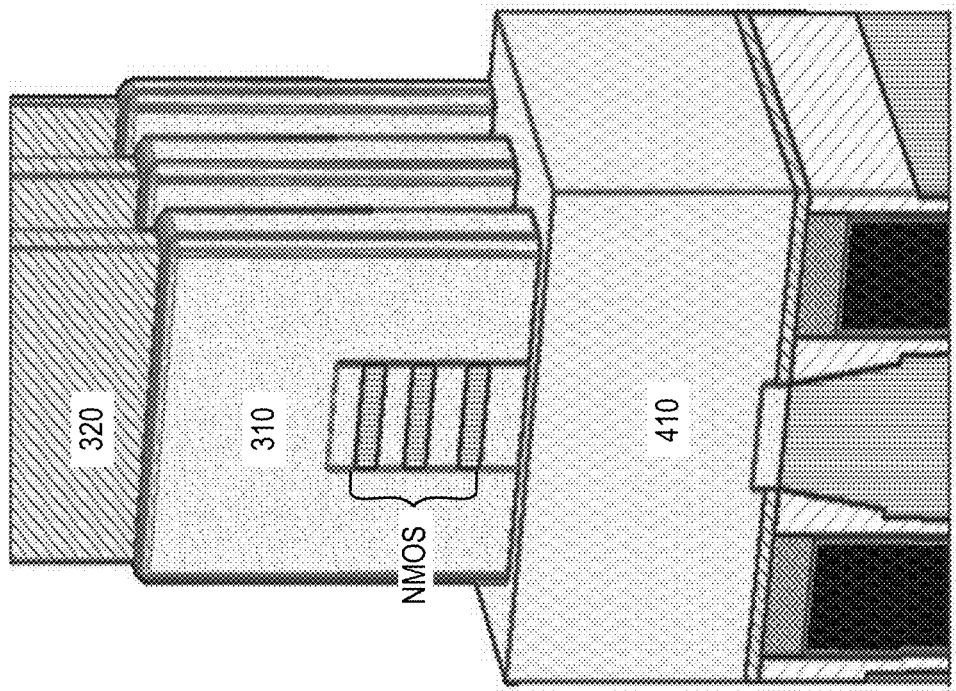
FIG. 4 shows the vertical placement needed for a recess etched PMD film in order to place a cover spacer to block the NMOS device from processing to be done on the PMOS device.
Figure 6:
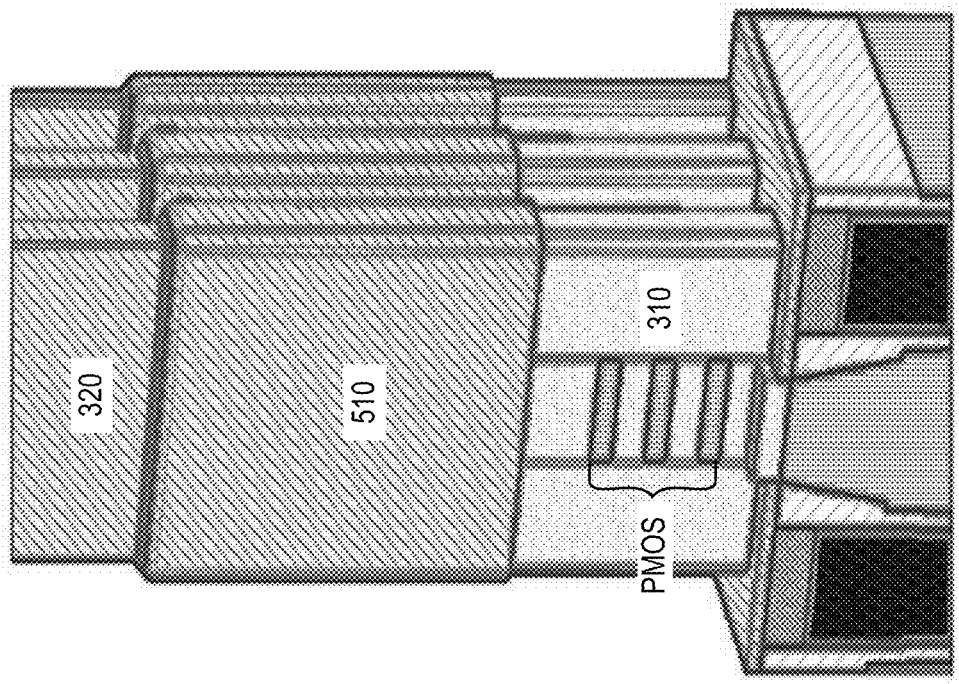
FIG. 6 shows the opening of the PMD film to reveal or uncover the bottom PMOS device nanosheets.
Figure 5:
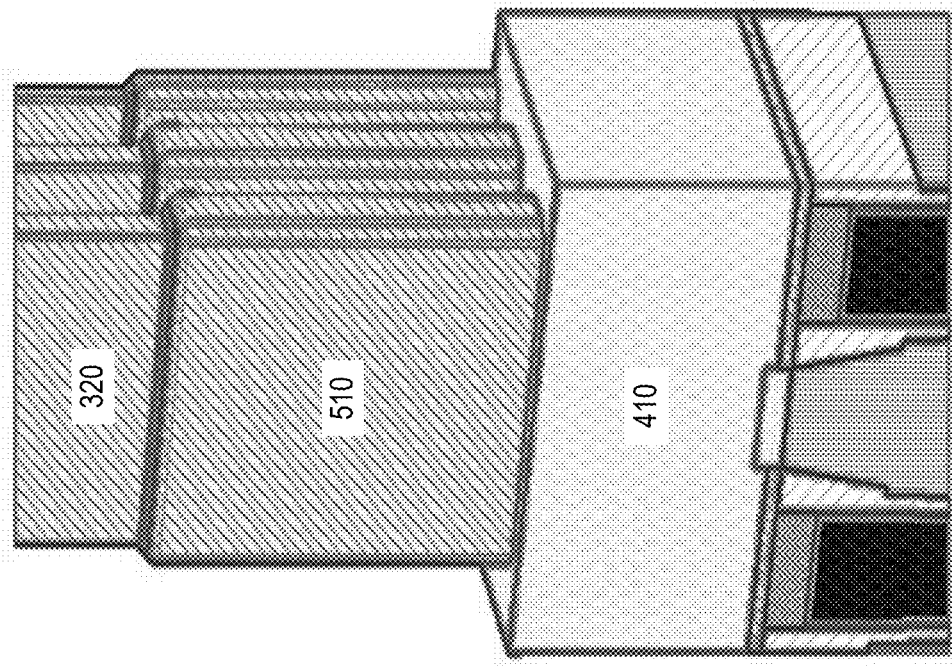
FIG. 5 shows the deposition of the cover spacer over the opened or uncovered NMOS device.

FIG. 4 shows the vertical placement needed for the recess etched PMD film 410 in order to place a cover spacer 510 (shown in FIG. 5) to block the NMOS device from processing to be done on the PMOS device. FIG. 5 shows the deposition of the cover spacer 510 over the opened or uncovered NMOS device (shown in FIG. 4) from FIG. 4. FIG. 6 shows the opening of the PMD film 410 to reveal or uncover the bottom PMOS device nanosheets.

The final height of this recessed PMD film 410 will have many interacting components including: (a) film thickness uniformity of the PMD film 410 after deposition, taking into account that this PMD film 410 is filling in significant topography in the form a large gate structure with corresponding large gate caps, in proximity to the trenches which can be as much as 300 nm deep and this corresponding variability can be significant based on local pattern density and can be on the order of magnitude of tens of nanometers; (b) the PMD film 410 is then CMP polished down to the height of the replacement gate cap 320 where CMP variability and dishing is typically several nanometers in range; (c) the etch recess will likewise have its unique variability based on normal across-wafer uniformity capability as well as pattern dependency based on the local pattern density of the recess within the trenches; and (d) variability in the gate cap thickness itself across the wafer which can be direct from the cap formation process to erosion seen during other up-stream CMP processes. In the end the accumulation of all of these sources of variability exceed the 10 nm tolerance of the vertical height placement of this PMD film 410 to act as a means to cover one device from its vertical complimentary pair, so some means of self-alignment in the vertical orientation is necessary in order to negate these components of variability.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

This disclosure pertains to methods to self-align the vertical recess of the pre-metallization dielectric (PMD) such that processing can be done independently on the nanosheets corresponding to either the NMOS and PMOS devices stacked overtop one another in a complimentary field-effective transistor (CFET) monolithic 3D device without interfering with their complimentary pair. An accumulation of individual process-induced variability associated with the multiple processing steps make the likelihood of high-volume manufacturability (HVM) of typical vertical, non end-pointing recess etches to be suspect. These challenges include (a) CMP uniformity and CMP-induced dishing of the PMD film, (b) variability of the replacement gate cap thickness used as a CMP-stop, (c) variability of the replacement gate and cap total height, (d) pattern loading effects associated with the vertical recess of the PMD film, (e) ability to stop the vertical PMD dielectric recess without any etch-stop or end-point detection, and (f) film thickness uniformity of the PMD film over the extreme topography which exists at this module.

The maximum NMOS to PMOS separation in a monolithic CFET device is provided to be a function of the pseudomorphic limit of the germanium component within the silicon germanium film which is used in the multi-lattice FIN structure to form the separation between the NMOS and PMOS silicon channels. For the case of SiGe30 this is usually correlated to a maximum NMOS/PMOS separation target of approximately 40 nm, meaning that within this 40 nm distance, the following must be placed: (a) the upper edge of the bottom S/D epitaxy contact in addition to any deposited CESL liner such as SiN or SiCN; (b) any formed silicide on the surface of the bottom S/D contact; (c) some minimum about of bottom interconnect metal in order to provide low-resistive connection to the bottom S/D contact; (d) some formed dielectric separation material (e.g., bottom interconnect cap) which will electrically isolate the bottom interconnect from the top S/D contact; and (e) the bottom face of the formed top S/D epitaxy contact from the top-tier device. In essence all of these must be fitted within this 40 nm dimensional window in order to form a proper CFET device. These factors necessitate the placement of the etch-recessed PMD film height to account for all of these factors, and as such the true window for the etch-recessed PMD film is more closer to 10 nm to 20 nm with the current assumptions that the residual bottom interconnect metal must extend 10 nm above the surface of the bottom S/D contact to provide adequate conductance within the metal interconnect structure, and the necessary height of the dielectric (e.g., the interconnect cap) separating the two vertical devices must be on the order of 10 nm accounting for the need to isolate the devices from one another as well as providing for minimum capacitance between said complimentary devices.

It can be clear that the accumulation of all of the individual components of process variability listed above make it extremely challenging to place the etch-recess PMD film to a point between 10 nm and 20 nm between the NMOS and PMOS devices when typical 3-sigma variability assignment for CMP dishing profiles is already 5 nm which may account for half of the tolerable budget, even before the other components of variability are assessed.

In this disclosure, a means of vertical self-alignment is provided, which significantly extends the tolerable variability of the etch-recessed PMD process. Techniques herein include a method of separation of stacked NMOS and PMOS devices in a complimentary field effective transistor (CFET) device in which limited separation between the complimentary devices is possible within a stacked architecture through a self-aligned process.

Self-alignment herein is obtained through the growth of un-doped SiGe (where Ge content can be varied based on optimization of the etch process to later remove the SiGe film with great degree of selectivity to silicon within the gate-all-around (GAA) channels). The un-doped SiGe is represented as a substitute contact or a replacement, or sacrificial contact, meaning that the goal of this initial epitaxy growth is to provide the means for the self-alignment. The "height" or growth thickness of the un-doped SiGe epitaxy needs to be such that it does not merge between the NMOS nanosheets and the complimentary PMOS nanosheets.

The "height" or growth thickness of the un-doped SiGe epitaxy needs to be such that it can merge between adjacent NMOS-to-NMOS or PMOS-to-PMOS adjacent faces; that is, the growth from two adjacent NMOS channels in two separate replacement gates forms a single merged SiGe sacrificial epitaxy. The growth from two adjacent NMOS channels in two separate replacement gates forms a single merged SiGe sacrificial epitaxy; however the NMOS and PMOS epitaxy films would not merge.

For accounting, such implementation point would be for foundry 2 nm technology nodes and beyond where the NMOS-to-PMOS separation would be on the order of 40 nm while the NMOS-to-NMOS as well as the complimentary PMOS-to-PMOS separation would be within one half the contacted poly pitch, or roughly 15 nm. Accordingly, merging NMOS-to-NMOS and PMOS-to-PMOS can be well controlled by the epitaxy growth deposition rate while ensuring that there is no merging between complimentary NMOS and PMOS devices.

In an embodiment, the sacrificial SiGe contacts are un-doped in order to prevent any diffusion of dopants normally found within S/D contacts (phosphorous or arsenic for NMOS S/D contacts; boron for PMOS S/D contacts) do not migrate into the silicon channel during any subsequent final source and drain epitaxy growth deposition steps. There is no concern of any germanium diffusion into the silicon channels through this process provided the high activation energy of germanium diffusion into silicon. Even if any germanium were to diffuse into the silicon channel, the germanium would be extremely limited and would be removed in subsequent processing steps before the formation of the actual source and drain contacts.

Once the replacement SiGe sacrificial contacts are formed, the PMD film can be deposited, CMP, and recessed etched back to the height of the topmost sacrificial contact. The topmost sacrificial contact provides a mechanism for the PMD film recess etch to have some end-point-detection (EDP) capability once it comes in contact with the SiGe, so the recess etch is no longer a "blind" recess without any EDP detection points. A protective film can be used in conjunction with the low-k gate spacer process to provide some margin of selectivity between the etched PMD film and the low-k gate spacer material. Once the top of the sacrificial contact is exposed (uncovered) and an EDP signal is generated, any amount of over-etch can be done on the PMD film to ensure that any process across-wafer variability associated with the PMD film deposition or CMP is addressed through the over-etch process after the EDP signal has been registered.

The over-etch can extend down as far as the height of the sacrificial contact which can be as large as twice the NMOS/PMOS separation distance and is again based on the height or thickness of the sacrificial epitaxy deposition. This means that the 10 nm to 20 nm "blind" landing point in the etch process can be replaced by one which now has a margin upward of 80 nm with the added benefit of having a sacrificial structure which will provide a suitable EDP signal. In this method, the top sacrificial contact from the top-tier device is now uncovered while the bottom sacrificial contact from the bottom-tier device is still fully encapsulated in the PMD film.

The top sacrificial contact can then be removed isotopically with great selectivity to the silicon. Such etch capability has been demonstrated on equipment manufactured by Tokyo Electron such as the CERTAS etch platform in which selectivity over 100:1 can be achieved in removing the uncovered SiGe selective to silicon. The germanium content of the SiGe sacrificial contact can be set such that maximum selectivity is achieved so that there is no damage or unintended etching of the silicon nanosheet in the sacrificial contact removal process. Selectivity between the isotropic etching of the SiGe sacrificial contact and the surrounding PMD film is less critical to this process given that there is typically a significant amount of PMD film still encapsulating the bottom sacrificial contact. Selectivity based on CERTAS capability well exceeds the requirements for this process. It is understood that in this process, the bottom sacrificial contact is still well encapsulated by the PMD film, so all etching of the SiGe is only happening on the top-tier device.

With the removal of the SiGe sacrificial contact from the top-tier, the silicon nanosheets from the top-tier device will now be revealed or uncovered while the nanosheets from the bottom-tier device will still have the SiGe sacrificial contact formed and encapsulated by the PMD film.

A cover spacer deposition of a dielectric with etch selectivity to the PMD film can then be deposited in order to cover or block the terminal ends of the silicon nanosheets from the top-tier devices such that subsequent processing can be done singularly on the bottom-tier device after its respective bottom sacrificial contact has been removed. The cover spacer will be a conformal deposition utilizing either chemical vapor deposition (CVD) or atomic layer deposition (ALD) and then subsequently etch-opened in order to remove any said blocking material on the upper lateral face of the recessed PMD film. Preferably, only the lateral sidewall is covered from which the terminal ends of the nanosheets are exposed in the top-tier device.

An alternate method herein includes a cover spacer approach to take the exposed or uncovered silicon nanosheets in the top-tier device and to isotopically recess the terminal ends of the nanosheets slightly into the low-k gate spacer. Tokyo electron CERTAS as well as other equipment have the capability to etch silicon with great selectivity to the neighboring PMD film as well as the low-k gate spacer (e.g., an oxide material) as well as to do this in a cyclic nature so that extremely accurate recessing can be done to ensure that the silicon nanosheets are not overly etched too far into the low-k gate spacer or into the actual replacement gate. After lateral recessing of the silicon nanosheets, instead of depositing a conformal cover spacer, this recess gap can then be filled with a selective deposition in which a dielectric with etch contrast to the surrounding PMD film can be filled into this gap.

In this process a self-assembled monolayer (SAM) material such as a silane-based (but not limited to) SAM can be used to selectively attach to the neighboring low-k gate spacer and surrounding PMD film, which will repel the nucleation of the dielectric layer to de deposited; however the SAM will have no affinity to the recess silicon, and as such the deposition would occur in this area only. In this approach no follow-up etch opening would be required. Other inhibitor molecules (longer or shorter chain) may be used. Furthermore, selectively deposited organic films on the dielectric with respect to the semiconductor can be of use.

After the top-tier silicon channel ends have been capped through either approach above, the PMD film can be fully removed which will uncover the bottom sacrificial contact. The PMD film (e.g., oxide) etch has selectivity to either the cover spacer material or the filled-in dielectric blocking the top-tier silicon nanosheets. The PMD film etch will not etch the shallow trench isolation (STI) oxide as this STI oxide will be protected by an etch-stop layer created before-hand in an earlier processing module.

Once the bottom-tier sacrificial contact is exposed following removal of the PMD film, the same etch process used above removes the bottom-tier sacrificial contact with greater than 100:1 selectivity to the silicon nanosheets in the bottom-tier device. The thickness of the blocking films over the top-tier silicon nanosheets provides for the protection of the silicon nanosheets in the blocked areas. Once the terminal ends of the silicon nanosheets are exposed from the bottom-tier device, conventional source and drain epitaxy deposition can be done to form the actual bottom-tier source and drain. Such processes include: (a) further cleaning of the exposed silicon; (b) further lateral recessing of the silicon nanosheet within the low-k gate spacer in order to form the desired junction; (c) growth of in-situ doped source and drain epitaxy to form the contact feature (if PMOS is assumed to be the bottom-tier device, this would involve the growth of boron-doped or other similar doping species within SiGe epitaxy; for NMOS as the bottom-tier this involves the growth of phosphorous-doped or other similar doping species within silicon epitaxy); (d) any additional implantation of dopants or implantation to form any desired alloys at the surface of the S/D contact; and (e) any additional etching processes in order to properly size the shape of the final S/D contact.

It is sometimes useful to incorporate an etch-stop-layer over the formed S/D contact with materials such as SiN or SiCN, with these films being called contact etch stop layers (CESLs). The CESLs are typically deposited by conformal CVD or ALD depositions, but in this case to avoid further covering the top-tier devices with additional blocking films over what they already have, this deposition can be done likewise through a selective deposition process. A SAM can be deposited either through spin-coating, vapor deposition or just solution dip method which will attach selectively to dielectric in contrast to any silicon or SiGe epitaxy films.

The CESL deposition can be done, where the SAM will repel the nucleation of the CESL film from the dielectric; thus the deposition would only be overtop the actual S/D contact. This approach can be also achieved by adding an inhibitor during the CVD or ALD process to selectively deposit the CESL layer.

The bottom tier interconnect process can be done on the corresponding device which includes the following processing steps. As the cover spacer or recessed etch-selective dielectric is encapsulating the top-tier devices, the choice of materials used in this capping is based on available selectivity capability of etching new PMD film selective to the capping materials. This can also lead to why one method such as laterally recessing the silicon and capping selectivity with an etch-selective dielectric may be more process-friendly as the recessed-cap materials will not be exposed significantly in anisotropic etching of the new PMD film which will house the metal interconnect. Several processing steps can be used, such as refilling the contact region with PMD film (typically silicon oxide), transferring any internal vias (such as vias connecting interconnects to buried power rails) as well as transferring the interconnect trench down to the depth of the bottom-tier contact, opening the CESL liner over the S/D contact, forming a silicide over the opened S/D contact, metallizing the formed via and interconnect structure with high conductive metals and any suitable liners (such materials for liners being TiN or TaN or $MoN_x$ or $RuN_x$ or $WN_x$) (such materials for high-conductive metals such as tungsten (W), cobalt (Co), or ruthenium (Ru), or molybdenum (Mo) or other high-conductive metals can be used), and capping the metallized interconnects with a suitable capping material. For the case of CFET in which the complimentary devices need to be electrically isolated, formation of an etch-selective dielectric film is executed by way of various deposition methods, but preference is a selective deposition process in which the etch-selective deposition is deposited only on the upper face of the metallized interconnect. The dielectric being deposited over the surface of the metallized interconnect should have some degree of etch selectivity to the surrounding PMD film and also have some adequately low dielectric constant in order to maintain an acceptable low capacitance between the top- and bottom-tier devices. Then re-filling with the PMD film such that the interconnect is now fully encapsulated.

The refilled PMD film can now be vertically recessed down to expose the top-tier nanosheets. In this manner, the recess can be setup to acquire an EDP signal when the recess reaches down to the interconnect cap (e.g., dielectric) protecting the bottom metal interconnect. Thus this is also now no longer a blind recess etch. Some degree of over-etch can be incorporated after the EDP signal is achieved in order to account for any process variability within the deposition and subsequent CMP steps of the PMD film fill. The amount of the over-etch can be as much as the height of the interconnect cap overtop the metal interconnect.

Once the PMD film is recessed to expose the top-tier device, the cover spacer can be removed, or the dielectric fill within the recessed silicon nanosheets can be removed with a precise etch process (atomic layer etching is an example of such an etch as would be a sensitive cyclic type of etch process such as a quasi-ALE process). This etch uncovers the top-tier silicon nanosheets while the bottom S/D contact and metal interconnect are fully encapsulated by the PMD film.

Once the terminal ends of the silicon nanosheets are exposed or uncovered from the top-tier device, typical source and drain epitaxy deposition can be done to form the actual bottom-tier source and drain. Such processes include: further cleaning of the exposed silicon; further lateral recessing of the silicon nanosheet within the low-k gate spacer in order to form the desired junction; growth of in-situ doped source and drain epitaxy to form the contact feature; if PMOS is assumed to be the upper-tier device, this then includes the growth of boron-doped or other similar doping species within SiGe epitaxy; for NMOS as the upper-tier this includes the growth of phosphorous-doped or other similar doping species within silicon epitaxy; any additional implantation of dopants or implantation to form any desired alloys at the surface of the S/D contact; and any additional etching processes in order to properly size the shape of the final S/D contact.

One option is to incorporate an etch-stop-layer over the formed S/D contact with materials such as SiN or SiCN, with these layers being called CESLs. The CESLs are typically deposited by conformal CVD or ALD depositions, but in this case to avoid further covering the top-tier devices with additional blocking films over what they already have, this deposition can be done likewise through a selective deposition process. A SAM can be deposited either through spin-coating, vapor deposition or just solution dip method which will attach selectively to dielectric in contrast to any silicon or SiGe epitaxy films. The CESL deposition can be done, where the SAM will repel the nucleation of the CESL film from the dielectric. Thus the deposition is only overtop the actual S/D contact. This approach can be also achieved by adding an inhibitor during the CVD or ALD process to selectively deposit the CESL layer.

The top tier interconnect process can be done on the corresponding device which includes the following processing steps. These processing steps can include: refilling the contact region with PMD film (typically silicon oxide); transferring any internal vias (such as vias connecting interconnects to buried power rails) as well as transferring the interconnect trench down to the depth of the bottom-tier contact; opening the CESL liner over the S/D contact; forming a silicide over the opened S/D contact; metallizing the formed via and interconnect structure with high conductive metals and any suitable liners (such materials for liners being TiN or TaN, or $MoN_x$ or $WN_x$ or $RuN_x$ such materials for high-conductive metals such as tungsten (W), cobalt (Co), or ruthenium (Ru) or molybdenum (Mo), or other high-conductive metals); capping the metallized interconnects with a suitable capping material; for the case of implementation of a self-aligned gate contact integration approach, an additional dielectric capping material can optionally be added with said material also having etch contrast between the PMD film as well as any capping material which will be used over the replacement metal gate; and re-filling with the PMD film such that the interconnect is now fully encapsulated.

Note that these example embodiments are primarily described in context of a simple CFET structure in which there is one PMOS or NMOS device vertically positioned over its corresponding complimentary pair. Techniques herein, however, can extend to devices in which multiple CFET devices are vertically positioned overtop one another. Techniques can be applied to CFET stacking, regardless if this is transistor-over-transistor (t-o-t) or gate-over-gate (g-o-g). Hence what is defined as lower or upper in these embodiments are representative as a position relative to the device actively being processed. For a stacked CFET with PMOS+NMOS+NMOS+PMOS with four stacked device tiers, the reference to bottom and top tier is in reference to the device tier being process at that point in the integration.

Accordingly, techniques herein enable processing methods for self-aligned method using sacrificial contact structures which allow for the accurate placement of covering films such that one device can be processed individually without impacting the devices on other tiers. This is beneficial compared to currently proposed methods of "blind" etch recesses because these blind etches lack the precision due to excessive variability across multiple up-stream processing steps to allow for precise landing within a 10 nm to 20 nm window that is required for monolithic CFET devices.

Example embodiments are illustrated in FIGS. 7-52. Note that this is for illustration purposes only and the step sequence provided can have some minor alterations, some steps can be excluded, and some steps may represent the combination of multiple processing steps.

FIGS. 7-38 are schematic views illustrating an exemplary method for fabricating a semiconductor structure 700 at various intermediate steps according to some embodiments of the present disclosure.

As shown in FIG. 7, the semiconductor structure 700 can include a fin structure 702 protruding from a substrate 710, e.g., Si or SiGe substrate, of a wafer. A plurality of buried power rail (BPR) structures 704a and 704b and their associated liners 705a and 705b can be arranged over the substrate 710 and positioned on both sides of the fin structure 702. The BPR structures 704a and 704b are buried at a bottom portion of the semiconductor structure 700, and can include tungsten (W), cobalt (Co), ruthenium (Ru), aluminum (Al), copper (Cu), molybdenum (Mo) or other conductive materials. The liners 705a and 705b can include TiN or TaN or $MoN_x$, or $RuN_x$ or $WN_x$. Additionally, a plurality of etch-selective dielectric caps 706a and 706b, such as aluminum oxide but is not limited to just this material as it can be any dielectric with etch selectivity to PMD oxide and SiN, can be positioned on the BPR structures 704a and 704b and function as isolation layers. In addition, an insulating layer (or short trench isolation (STI)) 708, e.g., silicon oxide, can be positioned between the BPR structures 704a and 704b and the fin structure 702. An etch stop layer 712 can be formed to cover the insulating layer 708 and the etch-selective dielectric caps 706a and 706b.

Still referring to FIG. 7, a first (or bottom) channel structure 742 can be positioned over the fin structure 702. The bottom channel structure 742 can include one or more first (or bottom) nanosheets or nanowires (e.g., silicon) that are stacked over the fin structure 702 and spaced apart from one another by an insulating layer 743. In an embodiment of FIG. 7, the bottom channel structure 742 includes three bottom nanosheets. The bottom channel structure 742 can be used to form a bottom-tier semiconductor device, e.g., CMOS or PMOS.

Further, a second (or top) channel structure 752 can be positioned over the bottom channel structure 742. The top channel structure 752 can include one or more second (or top) nanosheets or nanowires (e.g., silicon) that are stacked over the bottom channel structure 742 and spaced apart from one another by the insulating layer 743. In an embodiment of FIG. 7, the top channel structure 752 can include three top nanosheets. The top channel structure 752 can be used to form a top-tier semiconductor device, e.g., CMOS or PMOS.

The bottom channel structure 742 and the top channel structure 752 have their ends exposed or uncovered (side access) within a low-k gate spacer 740, such as SiO, SiOC, SiOCH, SiOCN. Also shown in FIG. 7 is a replacement gate cap 750 that is typically SiN.

As shown in FIG. 8, un-doped bottom and top sacrificial contacts 840 and 850, e.g., composed of SiGe where the germanium content is optimized to have etch selectivity to silicon, are grown epitaxially across the bottom-tier and top-tier semiconductor devices (e.g., PMOS and NMOS), respectively. The epitaxy growth is merged for common semiconductor devices. Specifically, all of the PMOS nanosheets of the bottom channel structure 742 will be covered by the same bottom sacrificial contact 840, all of the NMOS nanosheets of the top channel structure 752 will be covered by the same top sacrificial contract 850, which is different from the bottom sacrificial contact 840, and the bottom and top sacrificial contacts 840 and 850 will not merge with each other.

As shown in FIG. 9, a pre-metallization dielectric (PMD) film (e.g., silicon oxide) 910 is then deposited and planarized with stop on the top of the replacement gate cap 750 (e.g., SiN) (shown in FIG. 8).

As shown in FIG. 10, the PMD film 910 is etch-recessed and can achieve an end-point-detection (EDP) signal once the top sacrificial contact (e.g., SiGe) 850 is exposed or uncovered. A margin of over-etch can be applied to the PMD film 910 to account for upstream process variability and given the size of the top sacrificial contact 850 there is no penalty with respect to the integration in doing such over-etches.

Figure 11:
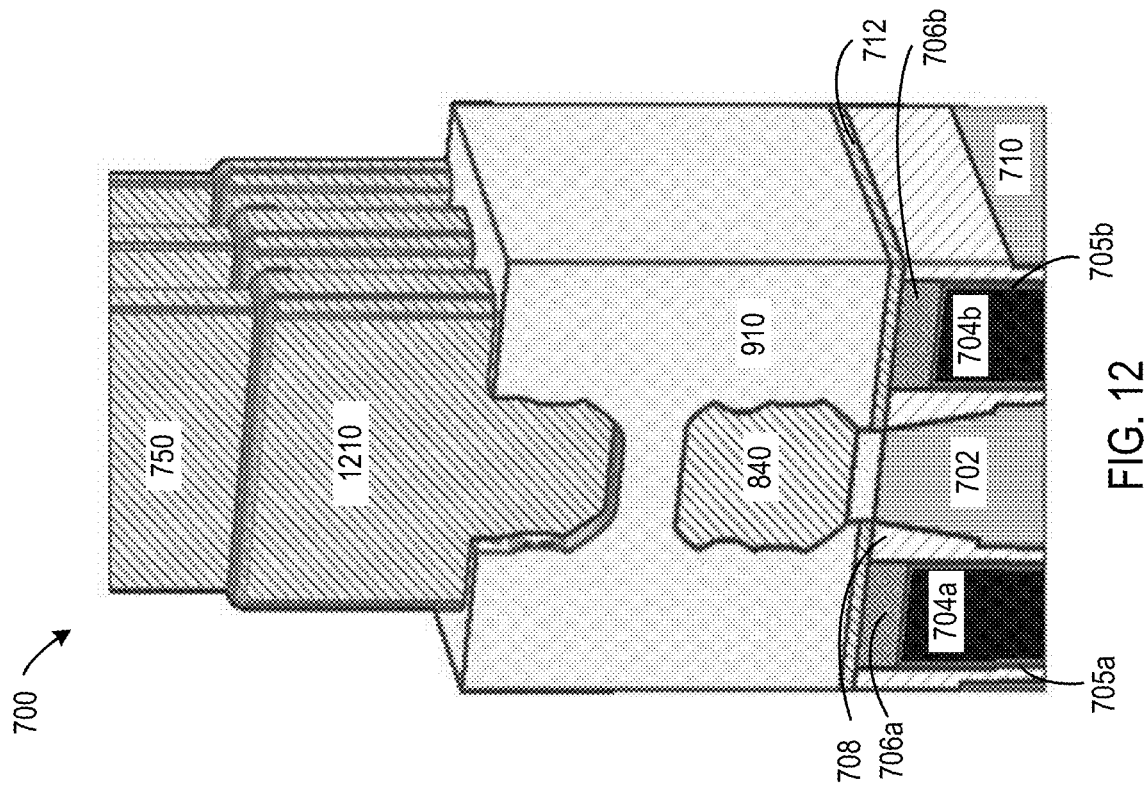

As shown in FIG. 11, after the top sacrificial contact 850 is partially uncovered, the top sacrificial contact 850 (e.g., SiGe) can be isotopically etched away with excellent selectivity to the silicon top nanosheets of the top channel structure 752 as well as selectivity to the remaining bottom portion of the PMD film 910. As can be seen below, even marginal selectivity to the PMD film 910 will have no negative impact to the down-stream integration. Selectivity between the top sacrificial contact 850 (e.g., SiGe) and the corresponding low-k gate spacer 740 will likewise be excellent based on material selection.

Figure 12:
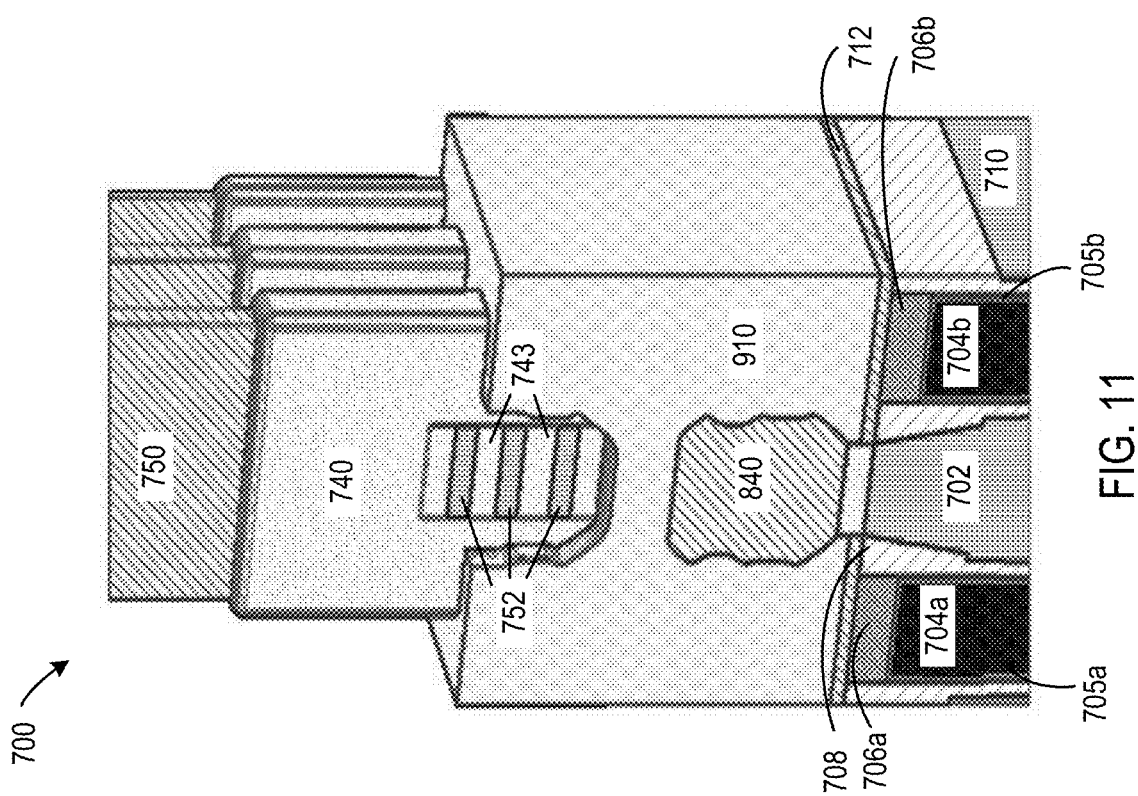

As shown in FIG. 12, in one optional integration a thin cover spacer 1210 can be conformally deposited in order to cover the exposed or uncovered top nanosheets (e.g., silicon) of the top channel structure 752 (shown in FIG. 11). The cover spacer 1210 can be SiN, SiCN, or some other dielectrics with good etch selectivity to the PMD film 910. The cover spacer 1210 will have a typical anisotropic spacer-open etch in order to open the bottom portion of the PMD film 910 while still adequately covering the top nanosheets of the top channel structure 752 (shown in FIG. 11).

Figures 13, 14:
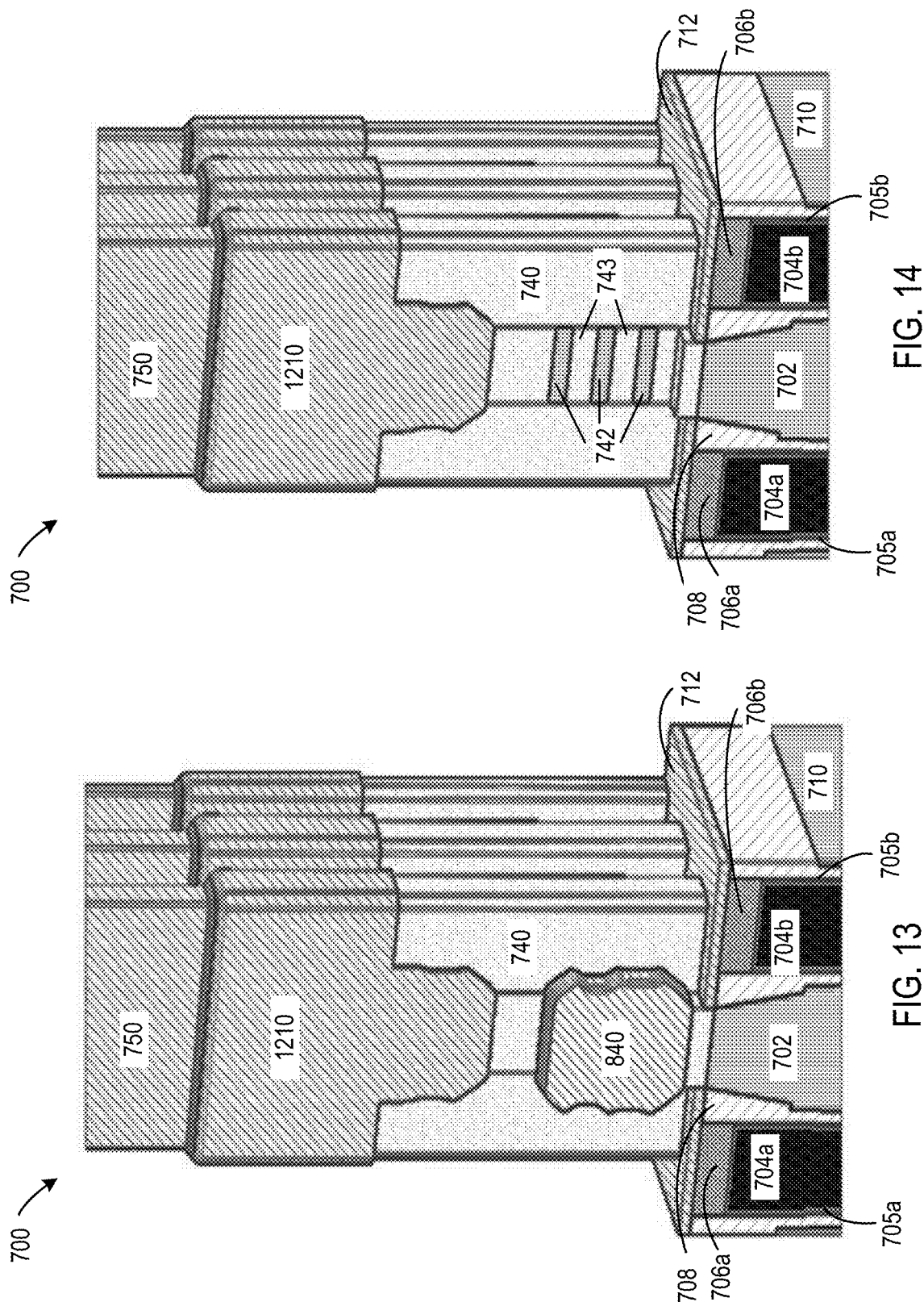

As shown in FIG. 13, the remaining bottom portion of the PMD film 910 (shown in FIG. 12) can be isotropically removed, leaving the cover spacer 1210 intact as well as the low-k gate spacer 740 and the bottom sacrificial contact 840. The STI oxide will have an etch stop layer deposited overtop in an earlier processing module which will prevent the PMD film 910 removal from removing any of the STI oxide.

As shown in FIG. 14, the bottom sacrificial contact 840 (e.g., SiGe) (shown in FIG. 13) is then etched in order to uncover the bottom nanosheets of the bottom channel structure 742 while maintaining the cover spacer 1210 over the top channel structure 752 (shown in FIG. 11).

As shown in FIG. 15, the uncovered silicon bottom nanosheets of the bottom channel structure 742 can then be laterally recessed through normal silicon cleaning as well as intentional recess to form the contact extension region in setting the device junction.

As shown in FIG. 16, in-situ doped bottom source and drain (S/D) contact 1640 is then grown from the bottom channel structure 742 (shown in FIG. 15). In this example, the bottom channel structure 742 is included in a PMOS so the composition of the source and drain (S/D) of the PMOS in this example would be boron-doped silicon germanium. It is provided that any additional processing can be done not fully described here to achieve desired contact resistance such as additional dopant implantation, annealing, and formation of silicon germanium alloys at the surface of the bottom S/D contact 1640. The illustration shows the boron-doped silicon germanium source and drain epitaxy (assuming that PMOS is being used for the bottom-tier semiconductor device in this example). It is important to note that in this integration, some dielectric isolation 1610 is shown at the interface between the bottom S/D contact 1640 and the bulk silicon residual FIN, e.g., the fin structure 702. For PMOS channel (e.g., the bottom channel structure 742) strain improvement, the dielectric isolation 1610 can be removed from the bottom S/D contact 1640 such that the source and drain of the PMOS can connect directly to the bulk silicon in order to provide additional strain on the PMOS channel through incorporation of silicon and silicon germanium lattice mismatch.

As shown in FIG. 17, a bottom contact etch stop layer (CESL) 1740 is then either conformally deposited, or in the case of the illustrated example, selectively deposited over the bottom S/D contact 1640.

As shown in FIG. 18, the contact region is then refilled with a PMD film (e.g., silicon oxide) 1810 and CMP with stop on the replacement gate cap 750 (e.g., SiN) (shown in FIG. 17) in order to fully encapsulate the bottom S/D contact 1640 and the bottom CESL 1740.

As shown in FIG. 19, a bottom interconnect trench 1910 is then transferred into the PMD film 1810 with stop and over-etch once the bottom S/D contact 1640, specifically the bottom CESL 1740, is uncovered. Such etches can be multiple based where a faster less-selective etch is used to reach the bottom S/D contact 1640 and then switched over to a more cyclic and more selective etch to reach a target depth to open the desired amount of the bottom S/D contact 1640. The uncovered bottom CESL 1740 is then etched with selectivity to the surrounding PMD film 1810 as well as selectivity to the cover spacer 1210 (shown in FIG. 17), which are used to cover the top nanosheets of the top channel structure 752 (shown in FIG. 11), to uncover a portion of the bottom S/D contact 1640.

As shown in FIG. 20, a bottom silicide 2010 is formed over the uncovered portion of the bottom S/D contact 1640 through a selective silicidation process.

As shown in FIG. 21, a bottom metal liner (not shown) is conformally deposited within the bottom interconnect trench 1910 and then filled with the final high conductive interconnect metal to form bottom interconnect 2110. This process can be done through multiple means such as (a) complete metal fill+CMP+recess etch down, (b) bottom-up type of deposition where the metal fill predominantly at the bottom portion of the bottom interconnect trench 1910 followed by a touch-up isotropic etch to remove the material from outside the desire regions, or (c) method in which the bottom metal liner is first recessed down to the same height of the bottom S/D contact 1640 followed by preferential metallization to this liner surface.

As shown in FIG. 22, a bottom interconnect cap 2210 (e.g., dielectric) is selectively deposited overtop the bottom interconnect 2110 which will serve as the dielectric isolation between the bottom-tier semiconductor device and the top-tier semiconductor device. For example, the bottom interconnect cap 2210 can isolate complementary semiconductor devices (e.g., NMOS and PMOS) of a CFET. The choice of the material for the bottom interconnect cap 2210 is based on etch selectivity to the PMD film 1810 and compatibility with down-stream unit process steps such as CVD epitaxy deposition. Typically, the incorporation of metals and metal oxides is not favored within CVD epitaxy chambers so any such materials may also need to be incorporated as a two-layer deposition such as a metal oxide with a grown or selectively deposited non-metal oxide or nitride overtop.

As shown in FIG. 23, the PMD film (e.g., dielectric) 1810 is re-filled into the remaining portion of the bottom interconnect trench 1910 (shown in FIG. 22) and CMP with stop on the replacement gate cap 750 (e.g., SiN) (shown in FIG. 17).

As shown in FIG. 24, the PMD film 1810 is recessed with end-point detection (EPD) achieved with the bottom interconnect cap 2210 overtop the bottom interconnect 2110. Any vertical recess of the PMD film 1810 must not remove the cover spacer 1210. As the cover spacer 1210 is deposited by a conformal spacer deposition overtop the uncovered top nanosheets of the top channel structure 752 (see FIGS. 11 and 12), the cover spacer 1210 is effectively "open" to the PMD recess even if the recess etch is done anisotropically. It is possible perhaps to use a selective PMD oxide etch using vapor-phase isotropic etch such as CERTAS. The PMD film 1810 can be over-etched below the top-most face of the bottom interconnect cap 2210 and the height of the bottom interconnect cap 2210 can be set to allow for this amount of over-etch to address up-stream process step variability such as PMD dielectric thickness uniformity and CMP dishing effects.

As shown in FIG. 25, the cover spacer 1210 (shown in FIG. 24) is isotropically removed to uncover the top nanosheets of the top channel structure 752. The uncovered top nanosheets of the top channel structure 752 are then cleaned and then recessed into the low-k gate spacer 740 in order to define the extension region of a top S/D contact 2650 (shown in FIG. 26).

As shown in FIG. 26, the top S/D contact 2650 is grown through in-situ doped CVD epitaxy process. For the case of this example the top S/D contact 2650 here is phosphorous doped silicon providing for NMOS device.

As shown in FIG. 27, a top CESL 2750 is then either conformally deposited, or in the case of the illustrated example, selectively deposited over the top S/D contact 2650.

As shown in FIG. 28, the top S/D contact 2650, the low-k gate spacer 740 and the replacement gate cap 750 (shown in FIG. 27) are then covered by the PMD film 1810 and CMP with stop on the replacement gate cap (e.g., SiN) 750 (shown in FIG. 27) in order to fully encapsulate the top S/D contact 2650 and the top CESL 2750 as well.

As shown in FIG. 29, a via-to-rail 2910 that will connect top interconnect 3510 (shown in FIG. 35) to the BPR structures, e.g., the BPR structure 704*b*. For example, the top-tier semiconductor device is NMOS, and the via-to-rail 2910 will connect the top interconnect 3510 to Vss.

As shown in FIG. 30, the etch stop layer 712 separating the insulating layer (STI) 708, e.g., silicon oxide, from the PMD film 1810 as well as the etch-selective dielectric cap 706*b* over the BPR structure 704*b* are opened. As the top CESL 2750 for the top S/D contact 2650 is not uncovered at this point, this allows for the top CESL 2750 to be a similar material composition to the etch stop layer 712 separating the insulating layer (STI) 708 from the PMD film 1810.

Figures 31, 32:
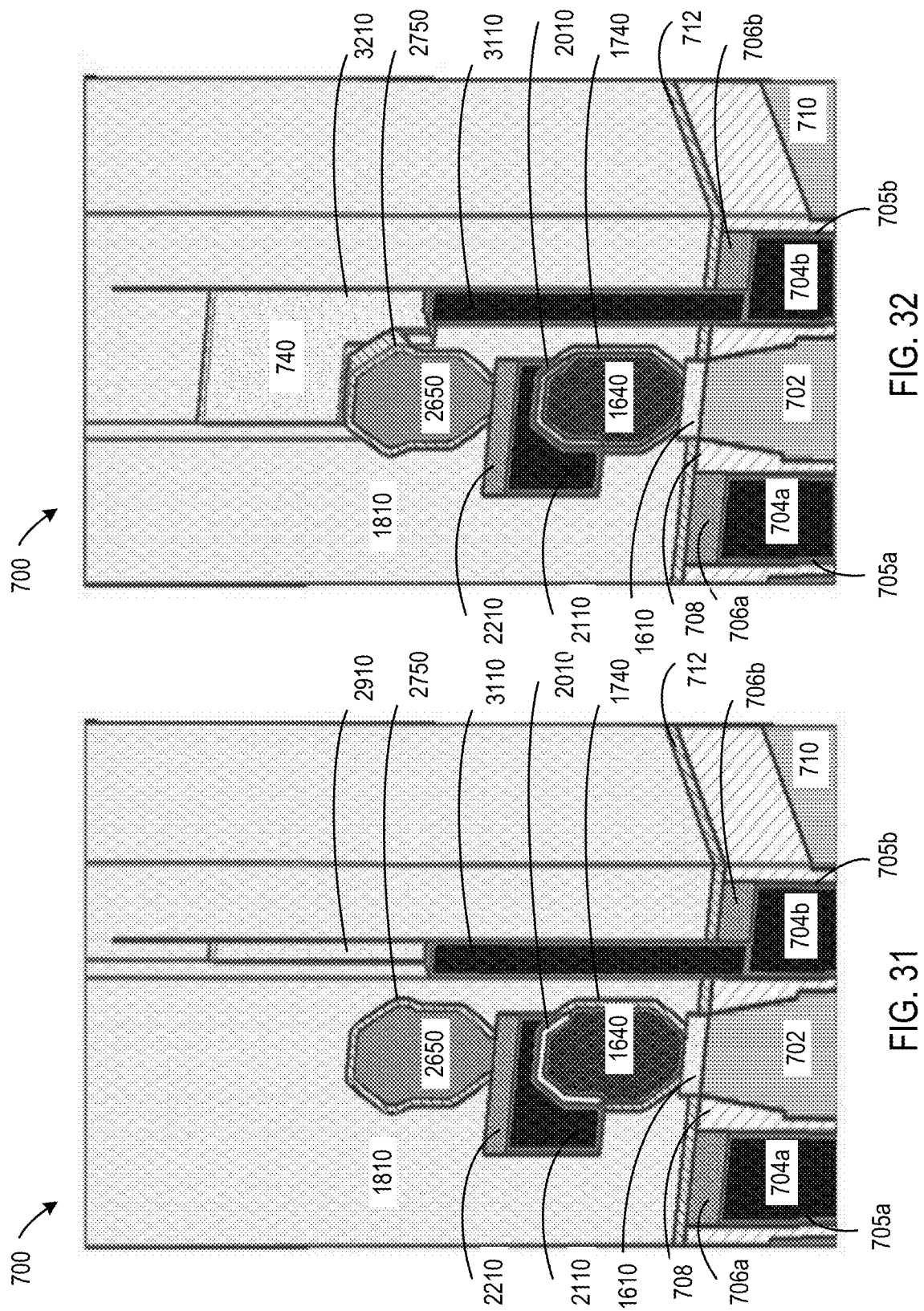

As shown in FIG. 31, the via-to-rail 2910 is partially filled with high conductive metal 3110, e.g., W, Co, Ru, Al, Cu, Mo, or other conductive materials; this can be accomplished through several methods such as bottom-fill deposition or even selective deposition where the conductive metal 3110 is grown with preferential selectivity to the BPR structure 704*b* (the surrounding dielectric would thus be blocked by the self-assembled monolayer (SAM) deposition which would exhibit preferential attachment to dielectrics such as silicon oxide). This process can likewise be done through a conventional fill/CMP/etch-recess without any detriment to the device performance as the recess does not necessarily need to be well-targeted as the top interconnect 3510 (shown in FIG. 35) will be metallized and will fill in any residual space within the via-to-rail 2910.

As shown in FIG. 32, a top interconnect trench 3210 is opened within the PMD film 1810 with an initial EPD on the top S/D contact 2650, specifically the top CESL 2750, and an optional secondary EPD on the conductive metal 3110 used to fill the via-to-rail 2910 connecting to the BPR structure 704*b*.

As shown in FIG. 33, the top CESL 2750 is removed from the top S/D contact 2650 to uncover the top S/D contact 2650.

As shown in FIG. 34, a top silicide 3410 is formed on the uncovered top S/D contact 2650. As there is some metal uncovered at this point on the partial via-to-rail fill (i.e., the conductive metal 3110), the unreacted silicidation metal needs to be extracted from the uncovered metal, or if there will be any over-etch of the top interconnect 3510 (shown in FIG. 35) below the height of the conductive metal 3110 that partially fills the via-to-rail 2910 (shown in FIG. 31), this will provide for larger surface area so that the placement of the bottom conductive silicidation metal does not have a significant impact to the overall resistance.

As shown in FIG. 35, the top interconnect 3510 is metallized. This likewise can be done across multiple methods including full metal fill+CMP+etch recess. Through more self-aligned methods such as depositing a metal liner within the top interconnect trench 3210 and recessing this metal liner down to the top S/D contact 2650 with the assist from a gap-fill material such as spin-on-organic films, removal of the metal liner from the recessed areas, and preferential deposition of the high conductive metal along the remaining recessed liner, or through bottom-up deposition approaches.

As shown in FIG. 36, an optional top interconnect cap (e.g., dielectric) 3610 with etch selectivity to the PMD film 1810 can be selectively deposited on top of the top interconnect 3510.

As shown in FIG. 37, the PMD film 1810 is refilled and CMP with stop on the replacement gate cap 750 (e.g., SiN) (shown in FIG. 27).

As shown in FIG. 38, the back-end-of-the-line (BEOL) processing is performed with via-to-contact (VCT) 3810 and via-to-gate (VG) 3820 from the BEOL metallization layers. The vias 3810 and 3820 will likewise pass within the multiple tiers of S/D contacts 1640 and 2650 and associated interconnects 2110 and 3510 as illustrated.

In the exemplary method shown in FIGS. 7-38, the blocking, i.e., the cover spacer 1210, will be exposed to a number of PMD film (i.e., the PMD film 1810 shown in FIGS. 18-24) etching and recess processes, and so should be a robust material with good etch selectivity. Alternatively, processes can be used that will not uncover the blocking material from any anisotropic etching process. For example, the process step shown in FIG. 11 can be substituted with a following alternate integration. In the following example, the initial three process steps shown in FIGS. 8-10 are similar and a sacrificial un-doped SiGe epitaxy film is used as the initial template to provide some means of either EPD or etch-stop to the initial PMD film recess.

FIGS. 39-52 are schematic views illustrating another exemplary method for fabricating a semiconductor structure 3900 at various intermediate steps according to some embodiments of the present disclosure.

As shown in FIG. 39, which follows the process step shown in FIG. 10, where the top sacrificial contact (e.g., SiGe) 850 is partially uncovered, the top sacrificial contact 850 can be isotopically etched away with excellent selectivity to the nanosheets (e.g., silicon) of the top channel structure 752 as well as selectivity to the PMD film 910. As can be seen, even marginal selectivity to the PMD film 910 will have no negative impact to the down-stream integration. The selectivity between the top sacrificial contact 850 (shown in FIG. 10) and the corresponding low-k gate spacer 740 is likewise excellent based on material selection. Also shown in FIG. 39, instead of the deposition of the cover spacer 1210, as shown in FIG. 12, the top nanosheets of the top channel structure 752 can be laterally recessed within the low-k gate spacer 740. A blocking material 3910 can then be selectively deposited within this nanosheet recess within the low-k gate spacer 740. The benefit of this method is that the blocking material 3910 will be relatively flush with the sidewall of the low-k gate spacer 740 and will not be exposed to any anisotropic etch recessing of the PMD film 910.

As shown in FIG. 40, the remaining bottom portion of the PMD film 910 (shown in FIG. 39) can be isotropically removed, leaving the blocking material 3910 intact as well as the low-k gate spacer 740 and the bottom sacrificial contact 840.

As shown in FIG. 41, the bottom sacrificial contact (e.g., SiGe) 840 is then etched in order to reveal or uncover the bottom nanosheets of the bottom channel structure 742. The uncovered bottom nanosheets (e.g., silicon) of the bottom channel structure 742 can then be laterally recessed through normal silicon cleaning as well as intentional recess to form the contact extension region in setting the device junction.

As shown in FIG. 42, an in-situ doped bottom S/D contact 4210 is then grown from the uncovered bottom nanosheets of the bottom channel structure 742 (shown in FIG. 41). In the illustrative explanation, the bottom-tier device is included in a PMOS so the composition of the source and drain (S/D) of the PMOS in this example would be boron-doped silicon germanium. It is provided that any additional processing can be done not fully described here to achieve desired contact resistance such as additional dopant implantation, annealing, and formation of silicon germanium alloys at the surface of the bottom S/D contact 4210. Note that in this integration, some dielectric isolation 4220 is shown at the interface between the bottom S/D contact 4210 and the bulk silicon residual FIN, e.g., the fin structure 702. For PMOS channel (e.g., the bottom channel structure 742) strain improvement, this dielectric isolation 4220 can be removed from the bottom S/D contact 4210 such that the source and drain of the PMOS can connect directly to the bulk silicon in order to provide additional strain on the PMOS channel through incorporation of silicon and silicon germanium lattice mismatch.

As shown in FIG. 43, a bottom contact etch stop layer (CESL) 4310 is then either conformally deposited, or in the case of the illustrated example, selectively deposited over the bottom S/D contact 4210.

As shown in FIG. 44, the contact region is then refilled with a PMD film 4410 and CMP with stop on the replacement gate cap (e.g., SiN) 750 (shown in FIG. 43) in order to fully encapsulate the bottom S/D contact 4210 and the bottom CESL 4310 as well.

As shown in FIG. 45, a bottom interconnect trench 4510 is then transferred into the PMD film 4410 with stop and over-etch once the bottom S/D contact 4210, specifically the bottom CESL 4310, is uncovered. Such etches can be multiple based where a faster less-selective etch is used to reach the bottom S/D contact 4210 and then switched over to a more cyclic and more selective etch to reach a target depth to open the desired amount of the bottom S/D contact 4210.

As shown in FIG. 46, the uncovered bottom CESL 4310 is thus etched with selectivity to the surrounding PMD film 4410, to uncover a portion of the bottom S/D contact 4210. The benefit here is that because the blocking material (e.g., dielectric) 3910 is embedded within the recessed top nanosheets of the top channel structure 752 (shown in FIG. 7), any anisotropic removal of the bottom CESL 4310 will not impact the blocking material 3910 and allow them to be of similar composition in terms of etch selectivity.

As shown in FIG. 47, a bottom silicide 4710 is formed over the uncovered regions of the opened bottom S/D contact 4210 through a selective silicidation process.

As shown in FIG. 48, a metal liner is conformally deposited within the bottom portion of the bottom interconnect trench 4510 and then filled with the final high conductive metal, such as W, Co, Ru, Al, Cu, or other conductive materials, to form bottom interconnect 4810. This process can be done through multiple means such as (a) complete metal fill+CMP+recess etch down, (b) bottom-up type of deposition where the metal fill predominantly at the bottom portion of the bottom interconnect trench 4510 followed by a touch-up isotropic etch to remove the material from outside the desired regions, or (c) method in which the metal liner is first recessed down to the same height of the bottom S/D contact 4210 followed by preferential metallization to this liner surface.

As shown in FIG. 49, a bottom interconnect cap 4910 (e.g., dielectric) is selectively deposited overtop the bottom interconnect 4810 which will serve as the dielectric isolation between the bottom-tier semiconductor device and the top-tier semiconductor device. For example, the bottom interconnect cap 4910 can isolate complementary semiconductor devices (e.g., NMOS and PMOS) of a CFET. The choice of the material of the bottom interconnect cap 4910 is based on etch selectivity to the PMD film 4410 and compatibility with down-stream unit process steps such as CVD epitaxy deposition. Typically, the incorporation of metals and metal oxides is not favored within CVD epitaxy chambers so any such materials may also need to be incorporated as a two-layer deposition such as a metal oxide with a grown or selectively deposited non-metal oxide or nitride overtop.

As shown in FIG. 50, the PMD film (e.g., dielectric) 4410 is re-filled into the remaining portion of the bottom interconnect trench 4510 (shown in FIG. 49) and CMP with stop on the replacement gate cap 750 (e.g., SiN) (shown in FIG. 43).

As shown in FIG. 51, the PMD film 4410 is recessed with end-point detection (EPD) achieved with the bottom interconnect cap (e.g., dielectric) 4910 overtop the bottom interconnect 4810. The PMD film 4410 can be over-etched below the top-most face of the bottom interconnect cap 4910 and the height of the bottom interconnect cap 4910 can be set to allow for this amount of over-etch to address up-stream process step variability such as PMD film thickness uniformity and CMP dishing effects.

As shown in FIG. 52, the blocking material 3910 is isotropically removed to uncover the top nanosheets of the top channel structure 752.

From this point on the integrations are identical between the two illustrated example embodiments. The process steps shown in FIGS. 25-38 can then be performed subsequently.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the present disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the present disclosure. Such variations are intended to be covered by the scope of this disclosure. As such, the foregoing descriptions of embodiments of the present disclosure are not intended to be limiting. Rather, any limitations to embodiments of the present disclosure are presented in the following claims.

What is claimed is:

1. A method, comprising:
providing a substrate having a first channel structure formed thereon and a second channel structure formed over the first channel structure;
forming a first sacrificial contact and a second sacrificial contact to cover ends of the first channel structure and the second channel structure, respectively;
covering the first sacrificial contact and the second sacrificial contact with a first fill material;
recessing a portion of the first fill material such that the second sacrificial contact is at least partially uncovered while the first sacrificial contact remains covered;
replacing the second sacrificial contact with a cover spacer so that the end of the second channel structure is covered by the cover spacer;
removing a remaining portion of the first fill material;
removing the first sacrificial contact to uncover the end of the first channel structure;
forming a first source/drain (S/D) contact to cover the end of the first channel structure;
covering the first S/D contact with a second fill material;
removing the cover spacer to uncover the end of the second channel structure; and
forming a second S/D contact at the end of the second channel structure.

2. The method of claim 1, wherein at least one of the first channel structure and the second channel structure includes one or more nanosheets arranged in a vertical stack and separated from one another vertically, and a corresponding one of the first sacrificial contact and the second sacrificial contact that covers the at least one of the first channel structure and the second channel structure covers all of the nanosheets.

3. The method of claim 1, wherein the first sacrificial contact and the second sacrificial contact are separated from each other.

4. The method of claim 1, wherein at least one of the first fill material and the second fill material includes pre-metallization dielectric (PMD).

5. The method of claim 1, wherein at least one of the first sacrificial contact and the second sacrificial contact is un-doped.

6. The method of claim 1, further comprising:
transferring an interconnect trench into the second fill material with stop once the first S/D contact is uncovered; and
forming within the interconnect trench first interconnect over the first S/D contact.

7. The method of claim 6, further comprising:
forming a first silicide over the first S/D contact,
wherein the first interconnect is formed over the first silicide.

8. The method of claim 7, further comprising:
forming a first contact etch stop layer (CESL) over the first S/D contact,
wherein the second fill material further covers the first CESL, and transferring an interconnect trench into the second fill material with stop once the first S/D contact is uncovered includes:
transferring an interconnect trench into the second fill material with stop once a portion of the first CESL is uncovered; and
removing the portion of the first CESL to uncover the first S/D contact.

9. The method of claim 8, wherein the first CESL and the second fill material are etch-selective.

10. The method of claim 6, further comprising forming a first interconnect cap overtop the first interconnect.

11. The method of claim 1, wherein the first fill material and the second sacrificial contact are etch-selective.

12. The method of claim 11, wherein the first fill material includes dielectric, and the second sacrificial contact includes SiGe.

13. The method of claim 1, wherein the first sacrificial contact and the first channel structure are etch-selective.

14. The method of claim 13, wherein the first sacrificial contact includes SiGe, and the first channel structure includes Si.

15. The method of claim 14, wherein the SiGe of the first sacrificial contact has a Ge content that is set such that maximum selectivity is achieved so that there is no damage or unintended etching of the first channel structure when the first sacrificial contact is removed.

16. The method of claim 1, further comprising:
laterally recessing the uncovered end of the first channel structure to form a contact extension region,
wherein the first S/D contact is formed in the contact extension region.

17. The method of claim 1, wherein the first fill material and the second fill material are etch-selective with respect to the cover spacer.

18. A method, comprising:
providing a substrate having a first channel structure formed thereon and a second channel structure formed over the first channel structure;
forming a first sacrificial contact and a second sacrificial contact to cover ends of the first channel structure and the second channel structure, respectively;
covering the first sacrificial contact and the second sacrificial contact with a first fill material;
recessing a portion of the first fill material such that the second sacrificial contact is at least partially uncovered while the first sacrificial contact remains covered;
removing the second sacrificial contact to uncover the end of the second channel structure;
laterally recessing the uncovered end of the second channel structure;
covering the recessed end of the second channel structure with a blocking material;
removing a remaining portion of the first fill material;
removing the first sacrificial contact to uncover the end of the first channel structure;
forming a first S/D contact to cover the end of the first channel structure;
covering the first S/D contact with a second fill material;
removing the blocking material to uncover the recessed end of the second channel structure; and
forming a second S/D contact at the uncovered recessed end of the second channel structure.

19. The method of claim 18, wherein the first fill material and the second sacrificial contact are etch-selective.

20. The method of claim 18, wherein the first sacrificial contact and the first channel structure are etch-selective.

* * * * *